(12) United States Patent
Lee

(10) Patent No.: US 10,141,336 B2
(45) Date of Patent: Nov. 27, 2018

(54) POWER GATE SWITCHING SYSTEM

(71) Applicant: SAMSUNG ELECTRONICS CO., LTD., Suwon-si, Gyeonggi-Do (KR)

(72) Inventor: Hoijin Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/713,779

(22) Filed: Sep. 25, 2017

(65) Prior Publication Data

US 2018/0012906 A1 Jan. 11, 2018

Related U.S. Application Data

(63) Continuation of application No. 15/247,439, filed on Aug. 25, 2016, now Pat. No. 9,786,685.

(30) Foreign Application Priority Data

| Aug. 26, 2015 | (KR) | 10-2015-0120327 |
| Mar. 14, 2016 | (KR) | 10-2016-0030470 |
| Aug. 10, 2016 | (TW) | 105125362 A |
| Aug. 24, 2016 | (KR) | 10-2016-0107890 |

(51) Int. Cl.
- *H01L 27/118* (2006.01)
- *H01L 27/02* (2006.01)
- *H01L 23/528* (2006.01)

(52) U.S. Cl.
CPC .... *H01L 27/11807* (2013.01); *H01L 27/0207* (2013.01); *H01L 23/5286* (2013.01); *H01L 2027/11831* (2013.01); *H01L 2027/11881* (2013.01)

(58) Field of Classification Search
CPC ..... H01L 27/11807; H01L 2027/11831; H01L 27/3297; H01L 27/0207; H01L 27/0218; H01L 27/088; H01L 27/0925; H01L 27/098; H01L 2027/11811; H03K 17/165; H03K 17/6871
See application file for complete search history.

(56) References Cited

U.S. PATENT DOCUMENTS

| 7,509,613 B2 | 3/2009 | Frenkil |
| 7,623,364 B2 | 11/2009 | Sasaki et al. |
| 7,755,306 B2 | 7/2010 | Shin et al. |
| 7,755,396 B2 | 7/2010 | Shin et al. |

(Continued)

FOREIGN PATENT DOCUMENTS

| JP | 2001135818 | 5/2001 |
| JP | 2005268695 | 9/2005 |

(Continued)

*Primary Examiner* — Shahed Ahmed
(74) *Attorney, Agent, or Firm* — F. Chau & Associates, LLC

(57) ABSTRACT

A semiconductor device includes: a virtual power line extended in a first direction; an n-well extended in the first direction, wherein the virtual power line and the n-well are disposed in a row; a first power gate switch cell disposed in the n-well; a second power gate switch cell disposed in the n-well, wherein the first and second power gate switch cells are first type cells; and a third power gate switch cell disposed in the n-well between the first and second power gate switch cells, wherein the third power gate switch cell is a second type cell different from the first type cells.

20 Claims, 23 Drawing Sheets

(56) References Cited

U.S. PATENT DOCUMENTS

| | | |
|---|---|---|
| 7,987,441 B2 | 7/2011 | Frenkil et al. |
| 8,302,059 B2 | 10/2012 | Pineda de Gyvez et al. |
| 8,499,272 B2 | 7/2013 | Ishii |
| 8,726,216 B2 | 5/2014 | Suzuki et al. |
| 2005/0161707 A1 | 7/2005 | Dikken |
| 2005/0218959 A1* | 10/2005 | Yamawaki .......... H01L 23/5223 |
| | | 327/334 |
| 2007/0133241 A1* | 6/2007 | Mumtaz .............. H02M 7/4807 |
| | | 363/131 |
| 2008/0093632 A1 | 4/2008 | Sakurabayashi |
| 2010/0171182 A1 | 7/2010 | Shin et al. |
| 2013/0200945 A1 | 8/2013 | Siguenza et al. |
| 2015/0035054 A1 | 2/2015 | Nishizaki |
| 2016/0027499 A1 | 1/2016 | Liaw |
| 2017/0062474 A1 | 3/2017 | Lee |

FOREIGN PATENT DOCUMENTS

| | | |
|---|---|---|
| JP | 2007042925 | 2/2007 |
| JP | 2008198756 | 8/2008 |
| KR | 1020070109415 | 11/2007 |

* cited by examiner

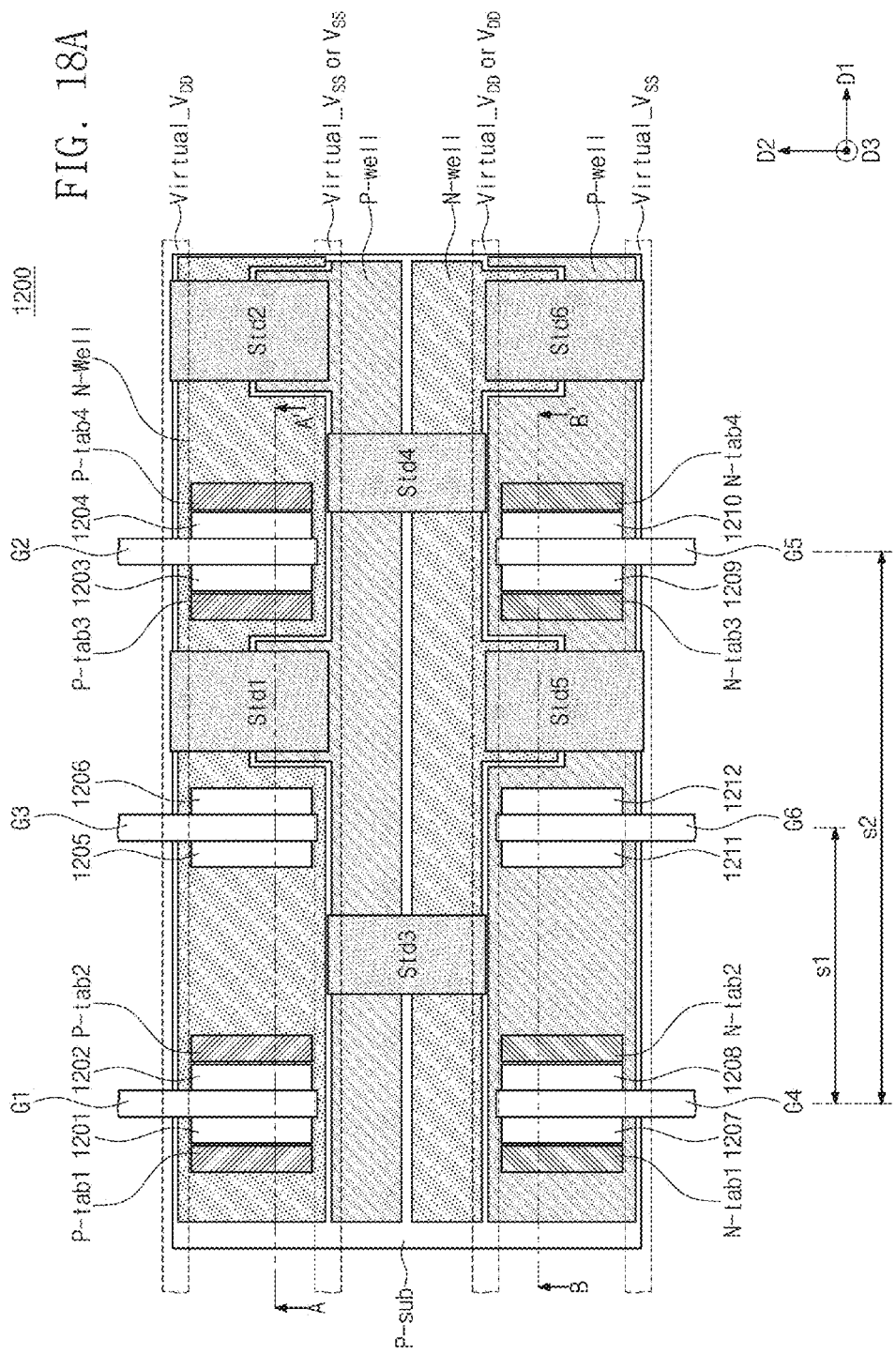

POWER GATE SWITCHING SYSTEM

CROSS-REFERENCE TO RELATED APPLICATIONS

This application is a continuation of co-pending U.S. application Ser. No. 15/247,439 filed Aug. 25, 2016, which claims priority under 35 U.S.C. § 119 to Korean Patent Application No. 10-2015-0120327, filed on Aug. 26, 2015, Korean Patent Application No. 10-2016-0030470 filed Mar. 14, 2016, Korean Patent Application No. 10-2016-0107890 filed Aug. 24, 2016 and Taiwan Patent Application No. 105125362 filed Aug. 10, 2016, the disclosures of which are incorporated by reference herein in their entireties.

TECHNICAL FIELD

The present inventive concept relates to a power gate switching system configured to supply a virtual power voltage to a standard cell.

DISCUSSION OF RELATED ART

Generally, to operate standard cells of a semiconductor device, a power voltage is supplied to a standard cell from the outside of the semiconductor device through a power gate switch. A voltage output from the power gate switch may be referred to as a virtual power voltage. To realize stable operation of the semiconductor device, the virtual power voltage should be equally applied to each of the standard cells. However, the semiconductor device may have a large voltage drop at a region that is relatively far from the power gate switch. For example, a standard cell far from the power gate switch may not receive the same level power voltage as a standard cell close to the power gate switch. In this case, the farther standard cell may malfunction.

SUMMARY

According to an exemplary embodiment of the present inventive concept, there is provided a semiconductor device comprising: a virtual power line extended in a first direction; an n-well extended in the first direction, wherein the virtual power line and the n-well are disposed in a row; a first power gate switch cell disposed in the n-well; a second power gate switch cell disposed in the n-well, wherein the first and second power gate switch cells are first type cells; and a third power gate switch cell disposed in the n-well between the first and second power gate switch cells, wherein the third power gate switch cell is a second type cell different from the first type cells.

According to an exemplary embodiment of the present inventive concept, there is provided a power gate switching system comprising: a first virtual power line extended in a first direction; a first power gate cell connected to the first virtual power line; a second power gate cell connected to the first virtual power line, wherein the first and second power gate cells each include at least one tap; and a third power gate cell connected to the first virtual power line and disposed between the first and second power gate cells, wherein the third power gate cell does not include a tap, and wherein the first to third power gate cells and the first virtual power line are arranged in a first row.

According to an exemplary embodiment of the present inventive concept, there is provided a power gate switching system comprising: a first row including a first virtual power line, a first power gate cell and a second power gate cell, wherein the first power gate cell includes a first gate electrode disposed between first and second diffusion regions, and at least one tab, wherein the second power gate cell includes a second gate electrode disposed between third and fourth diffusion regions and does not include a tab; and a second row including a second virtual power line, a third power gate cell and a fourth power gate cell, wherein the third power gate cell includes a third gate electrode disposed between fifth and sixth diffusion regions, and at least one tab, and the fourth power gate cell includes a fourth gate electrode disposed between seventh and eighth diffusion regions and does not include a tab, and wherein the fourth power gate cell is connected to the second power gate cell.

BRIEF DESCRIPTION OF THE DRAWINGS

The above and other features of the present inventive concept will become more clearly understood by describing in detail exemplary embodiments thereof with reference to the accompanying drawings.

FIG. 18A is a plan view illustrating a power gate switching system according to an exemplary embodiment of the present inventive concept.

DETAILED DESCRIPTION OF THE EMBODIMENTS

Figure 1:
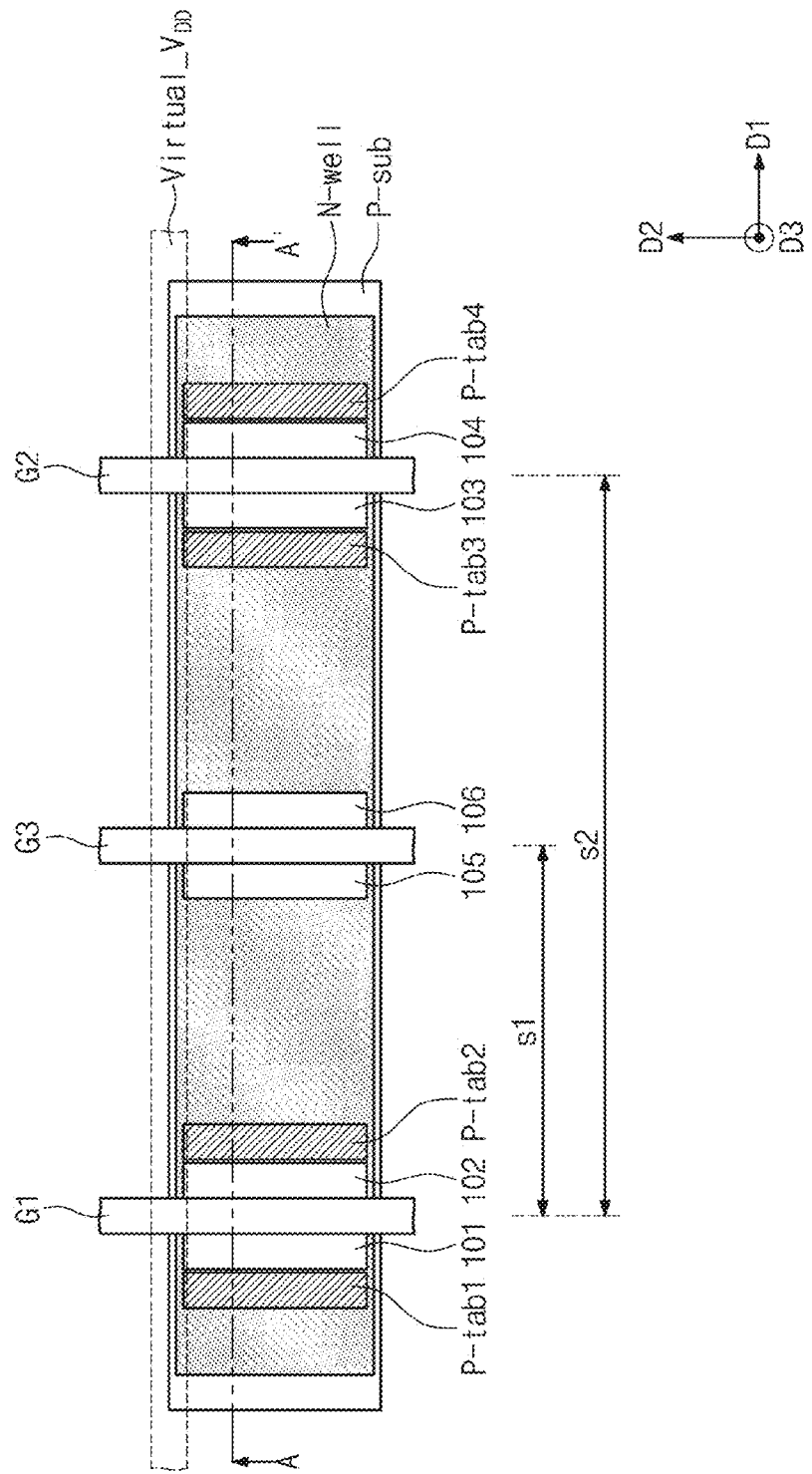
FIG. 1 is a plan view illustrating a power gate switching system according to an exemplary embodiment of the present inventive concept.
Figure 2:
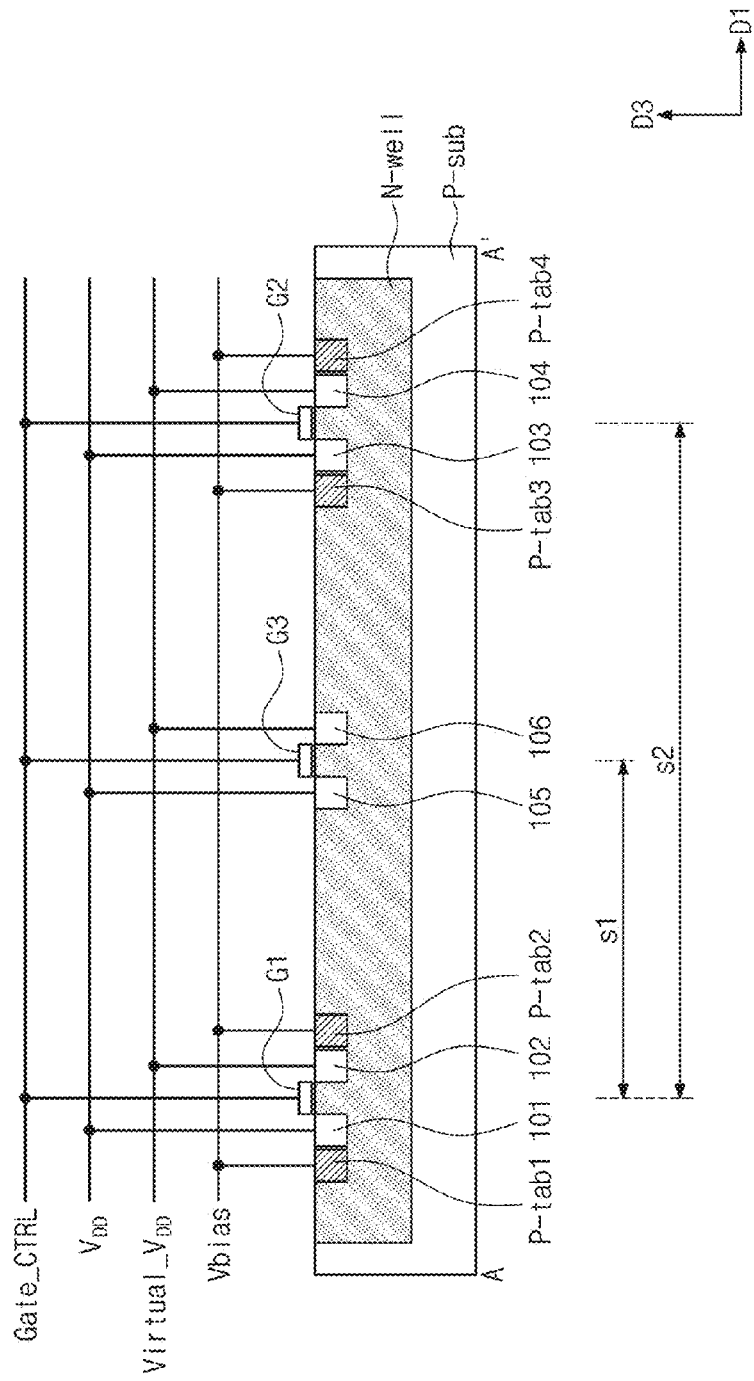
FIG. 2 is a sectional view taken along line A-A' of FIG. 1 according to an exemplary embodiment of the present inventive concept.

FIG. 1 is a plan view illustrating a power gate switching system 100 according to an exemplary embodiment of the inventive concept. FIG. 2 is a sectional view taken along line A-A' of FIG. 1 according to an exemplary embodiment of the inventive concept.

Referring to FIGS. 1 and 2, the power gate switching system 100 may include a p-type substrate P-sub, an N-well, which is formed in the p-type substrate P-sub, first to sixth diffusion regions 101, 102, 103, 104, 105, and 106, which are formed in the N-well, a first gate electrode G1, which is formed on the N-well and between the first and second diffusion regions 101 and 102, a second gate electrode G2, which is formed on the N-well and between the third and fourth diffusion regions 103 and 104, a third gate electrode G3, which is formed on the N-well and between the fifth and sixth diffusion regions 105 and 106, a first p-tab P-tab1, which is formed in the N-well adjacent to the first diffusion region 101, a second p-tab P-tab2, which is formed in the N-well adjacent to the second diffusion region 102, a third p-tab P-tab3, which is formed in the N-well adjacent to the third diffusion region 103, and a fourth p-tab P-tab4, which is formed in the N-well adjacent to the fourth diffusion region 104.

The N-well may extend in a first direction D1. For example, the N-well may be a region doped with n-type impurities.

The first to sixth diffusion regions 101 to 106 may be formed in the N-well to extend in the first direction D1. The first and second diffusion regions 101 and 102 may be spaced apart from each other, and the first gate electrode G1 may be provided on a region between the first and second diffusion regions 101 and 102. The third and fourth diffusion regions 103 and 104 may be spaced apart from each other, and the second gate electrode G2 may be provided on a region between the third and fourth diffusion regions 103 and 104. The fifth and sixth diffusion regions 105 and 106 may be formed between the second and third diffusion regions 102 and 103. The fifth and sixth diffusion regions 105 and 106 may be spaced apart from each other, and the third gate electrode G3 may be provided on a region between the fifth and sixth diffusion regions 105 and 106. Each of the first to sixth diffusion regions 101 to 106 may be doped with p-type impurities.

For example, the size of each of the fifth and sixth diffusion regions 105 and 106 may be smaller than that of each of the first and fourth diffusion regions 101 to 104. In addition, the size of the third gate electrode G3 (e.g., a width in the first direction D1) may be smaller than the size of the first or second gate electrode G1 or G2 (e.g., a width in the first direction D1).

A power voltage $V_{DD}$ may be supplied to the first diffusion region 101. In the case where a gate voltage Gate_CTRL is applied to the first gate electrode G1 to form a first channel between the first and second diffusion regions 101 and 102, the power voltage $V_{DD}$ applied to the first diffusion region 101 may be output in the form of a virtual power voltage Virtual_$V_{DD}$ through the first channel and the second diffusion region 102. The virtual power voltage Virtual_$V_{DD}$ may be supplied to a standard cell for realizing a logic circuit.

The power voltage $V_{DD}$ may be supplied to the third diffusion region 103. In the case where the gate voltage Gate_CTRL is applied to the second gate electrode G2 to form a second channel between the third and fourth diffusion regions 103 and 104, the power voltage $V_{DD}$ applied to the fourth diffusion region 104 may be output in the form of the virtual power voltage Virtual_$V_{DD}$ through the second channel and the fourth diffusion region 104. The virtual power voltage Virtual_$V_{DD}$ may be supplied to the standard cell for realizing the logic circuit.

The power voltage $V_{DD}$ may be supplied to the fifth diffusion region 105. In the case where the gate voltage Gate_CTRL is applied to the third gate electrode G3 to form a third channel between the fifth and sixth diffusion regions 105 and 106, the power voltage $V_{DD}$ applied to the fifth diffusion region 105 may be output as the virtual power voltage Virtual_$V_{DD}$ through the third channel and the sixth diffusion region 106. The virtual power voltage Virtual_$V_{DD}$ may be supplied to the standard cell for realizing the logic circuit.

An insulating layer may be further formed between the first gate electrode G1 and the N-well, between the second gate electrode G2 and the N-well, and between the third gate electrode G3 and the N-well.

The first and second p-tabs P-tab1 and P-tab2 may be formed adjacent to the first and second diffusion regions 101 and 102, respectively. The third and fourth p-tabs P-tab3 and P-tab4 may be formed adjacent to the third and fourth diffusion regions 103 and 104, respectively. For example, each of the first to fourth p-tabs P-tab1 to P-tab4 may be a region doped with n-type impurities. The first to fourth p-tabs P-tab1 to P-tab4 may have doping concentrations that are different from that of the N-well. The first and fourth p-tabs P-tab1 to P-tab4 may extend in a second direction D2. Furthermore, although the first p-tab P-tab1 is illustrated to be not in direct contact with the first diffusion region 101, the first p-tab P-tab1 may be in direct contact with the first diffusion region 101. The second to fourth p-tabs P-tab2 to P-tab4 may be formed in a similar manner to the first p-tab P-tab1.

A bias voltage Vbias may be applied to the first to fourth p-tabs P-tab1 to P-tab4. The bias voltage Vbias may prevent a latch-up phenomena from occurring in the power gate switching system 100. Although the bias voltage Vbias is shown to be separately applied to the first to fourth p-tabs P-tab1 to P-tab4, the power voltage $V_{DD}$ may be applied to the first to fourth p-tabs P-tab1 to P-tab4 in place of the bias voltage $V_{DD}$.

A distance between the second and third p-tabs P-tab2 and P-tab3 may be determined in consideration of a doping concentration of the N-well. For example, the second and third p-tabs P-tab2 and P-tab3 may be spaced apart from each other by a distance suitable to prevent the latch-up phenomena from occurring in the power gate switching system 100. For example, a distance between these tabs may be about 50 μm in a 10 nm logic process. If the distance between the second and third p-tabs P-tab2 and P-tab3 is greater than a critical distance (e.g., a distance at which the latch-up phenomena can be prevented), at least one additional p-tab may be provided near the fifth or sixth diffusion region 105 or 106. Even when the distance between the second and third p-tabs P-tab2 and P-tab3 is within a range suitable to prevent the latch-up phenomena, one of the standard cells located between the second and third diffusion regions 102 and 103 may not receive enough of the power voltage $V_{DD}$. Accordingly, by providing the fifth diffusion region 105, the sixth diffusion region 106, and the third gate electrode G3, without an additional p-tab, a stable power voltage $V_{DD}$ may be supplied to the standard cells located between the second and third diffusion regions 102 and 103.

Referring again to FIGS. 1 and 2, a distance (e.g., s1) between the first and third gate electrodes G1 and G3 is illustrated to be half a distance (e.g., s2) between the first gate electrode G1 and the second gate electrode G2. However, in an exemplary embodiment of the inventive concept, the distance (e.g., s1) between the first and third gate electrodes G1 and G3 may range from ¼ times to ¾ times the distance (e.g., s2) between the first and second gate electrodes G1 and G2. In an exemplary embodiment of the inventive concept, to allow the third channel to be formed at an overlapping region between the third gate electrode G3 and the N-well, the fifth and sixth diffusion regions 105 and 106 may be disposed at positions that are appropriately adjusted in consideration of a position of the third gate electrode G3.

Figure 3:
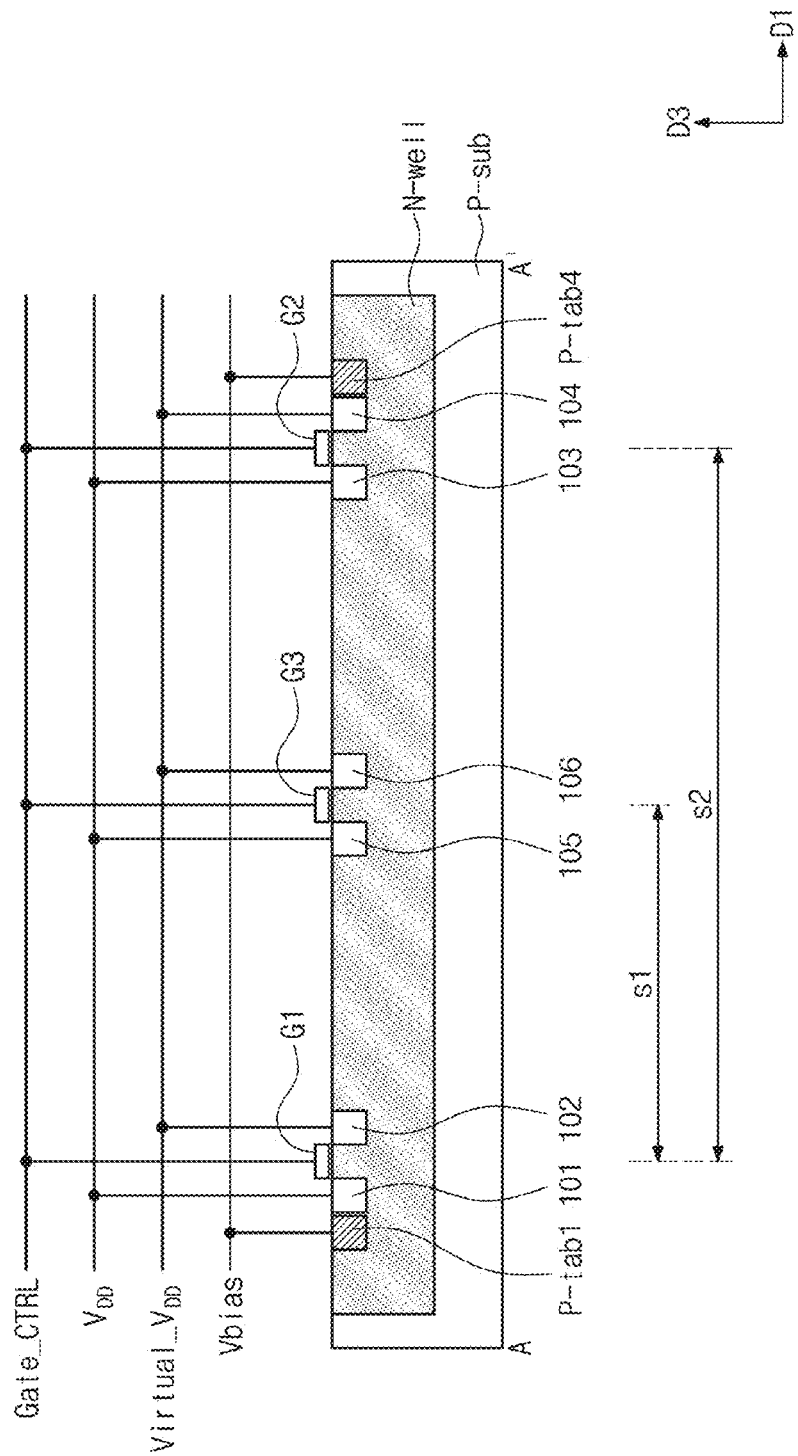
FIG. 3 is a sectional view taken along line A-A' of FIG. 1 according to an exemplary embodiment of the present inventive concept.

As shown in FIGS. 1 and 2, four p-tabs may be formed in the power gate switching system 100. However, the inventive concept may not be limited thereto; for example, as shown in FIG. 3, the power gate switching system 100 may include two p-tabs. Reference numerals in FIG. 3 that are the same as those in FIGS. 1 and 2 may denote the same or similar elements. As an example, the p-tab P-tab1 may be provided adjacent to the first diffusion region 101 and the p-tab P-tab4 may be provided adjacent to the fourth diffusion region 104, as shown in FIG. 3. As another example, the p-tab P-tab1 may be provided adjacent to the first diffusion region 101 and the p-tab P-tab3 may be provided adjacent to the third diffusion region 103. As yet another example, and the p-tab P-tab2 may be provided adjacent to the second diffusion region 102 and the p-tab P-tab4 may be provided adjacent to the 104.

Figure 4:
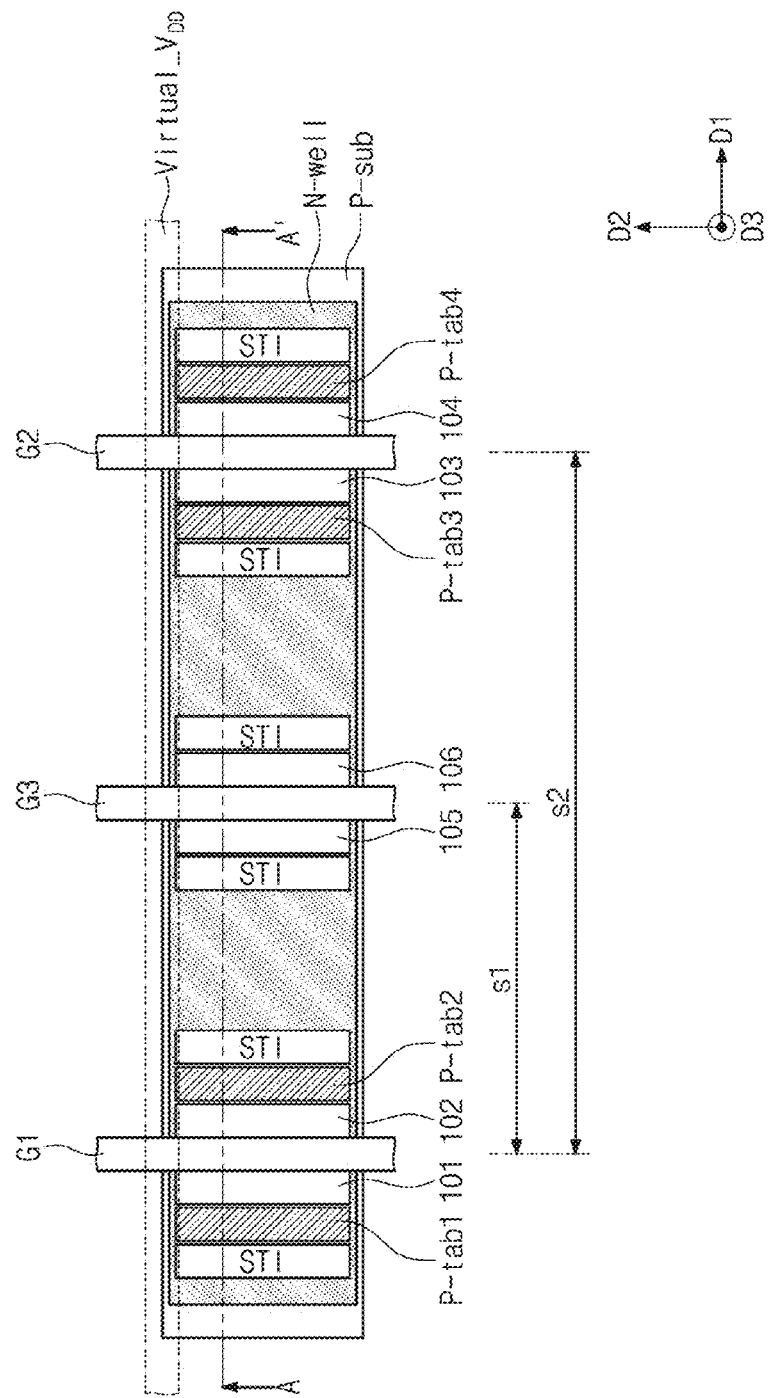
FIG. 4 is a plan view illustrating a power gate switching system according to an exemplary embodiment of the present inventive concept.
Figure 5:
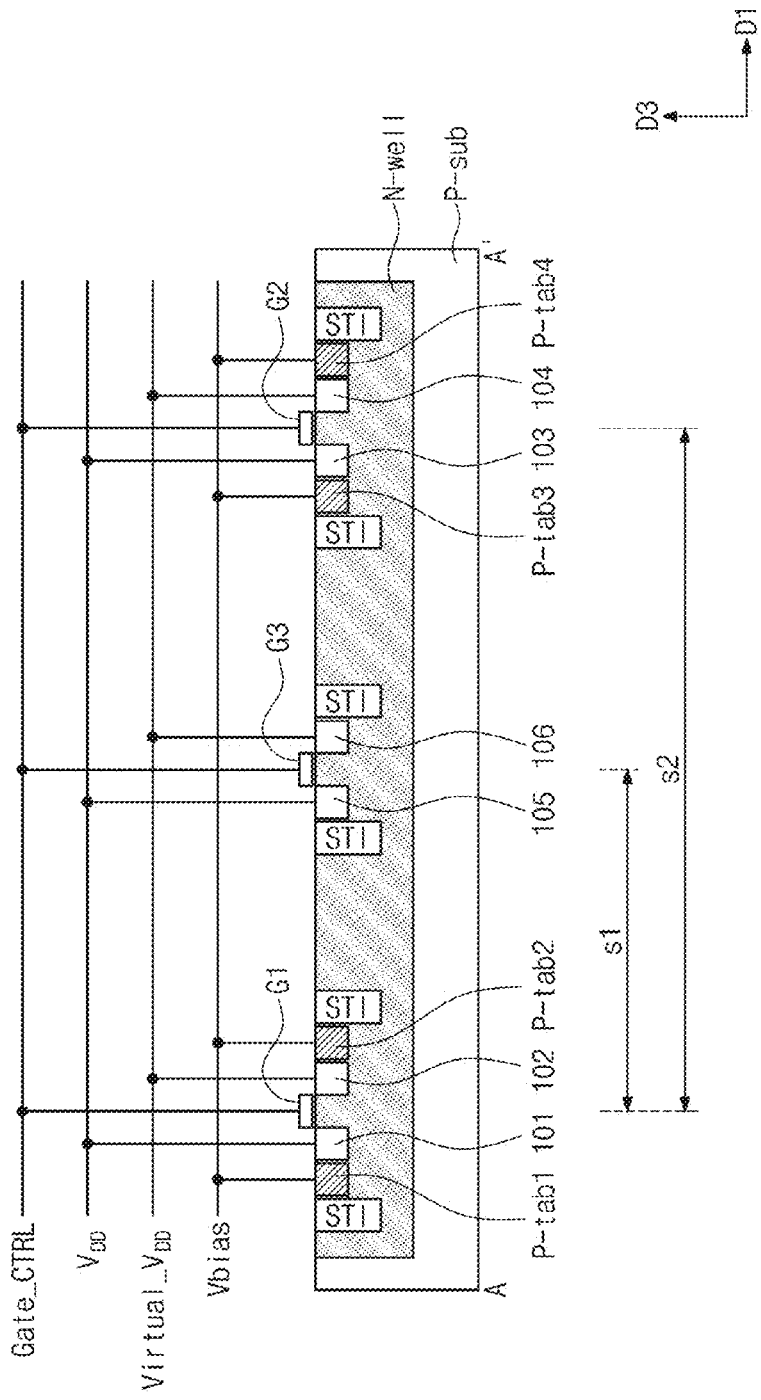
FIG. 5 is a sectional view taken along line A-A' of FIG. 4 according to an exemplary embodiment of the present inventive concept.

FIG. 4 is a plan view illustrating a power gate switching system 100 according to an exemplary embodiment of the inventive concept. FIG. 5 is a sectional view taken along line A-A' of FIG. 4 according to an exemplary embodiment of the inventive concept. Reference numerals in FIGS. 4 and 5 that are the same as those in FIGS. 1 and 2 may denote the same or similar elements.

The power gate switching system 100 may include device isolation layers STI, which may be formed using a shallow-trench isolation technology. The device isolation layers STI may be provided to isolate standard cells that are located between the second p-tab P-tap2 and the fifth diffusion region 105 or between the sixth diffusion region 106 and the third p-tab P-tap3. Each of the device isolation layers STI may be adjacent to a corresponding one of the p-tabs and extend in the second direction D2. The device isolation layer STI is illustrated to be not in direct contact with the p-tab, but in an exemplary embodiment of the inventive concept, the device isolation layer STI may be in direct contact with the p-tab.

In an exemplary embodiment of the inventive concept, the device isolation layers STI may be formed of or include a silicon oxide layer. For example, the device isolation layers STI may be formed of at least one of high-density plasma (HDP) oxide, TetraEthylOrthoSilicate (TEOS), plasma-enhanced tetraethylorthosilicate (PE-TEOS), $O_3$-TEOS, Undoped Silicate Glass (USG), PhosphoSilicate Glass (PSG), Borosilicate Glass (BSG), BoroPhosphoSilicate Glass (BPSG), Fluoride Silicate Glass (FSG), Spin On Glass (SOG), or any combination thereof.

Figure 6:
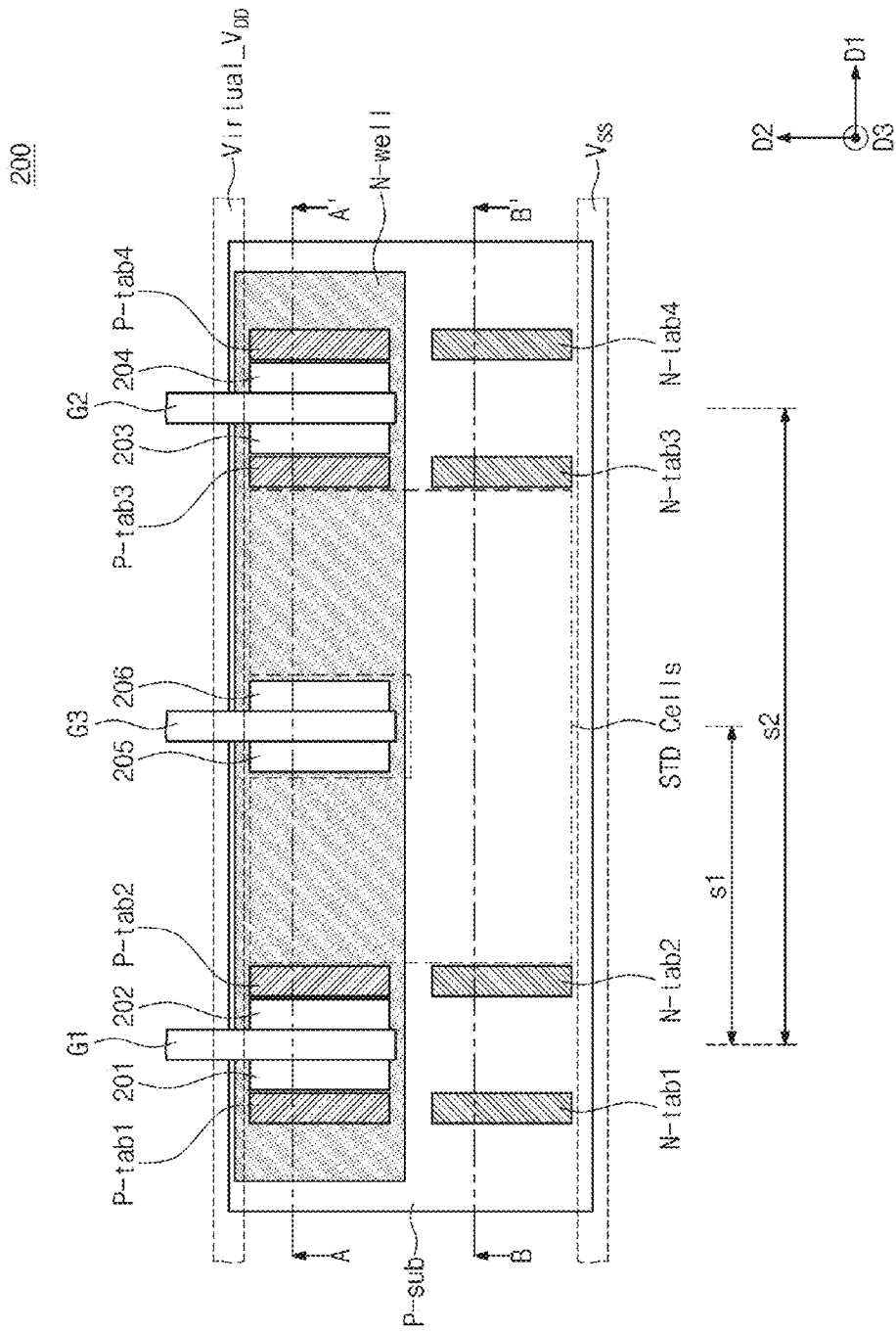
FIG. 6 is a plan view illustrating a power gate switching system according to an exemplary embodiment of the present inventive concept.
Figure 7:
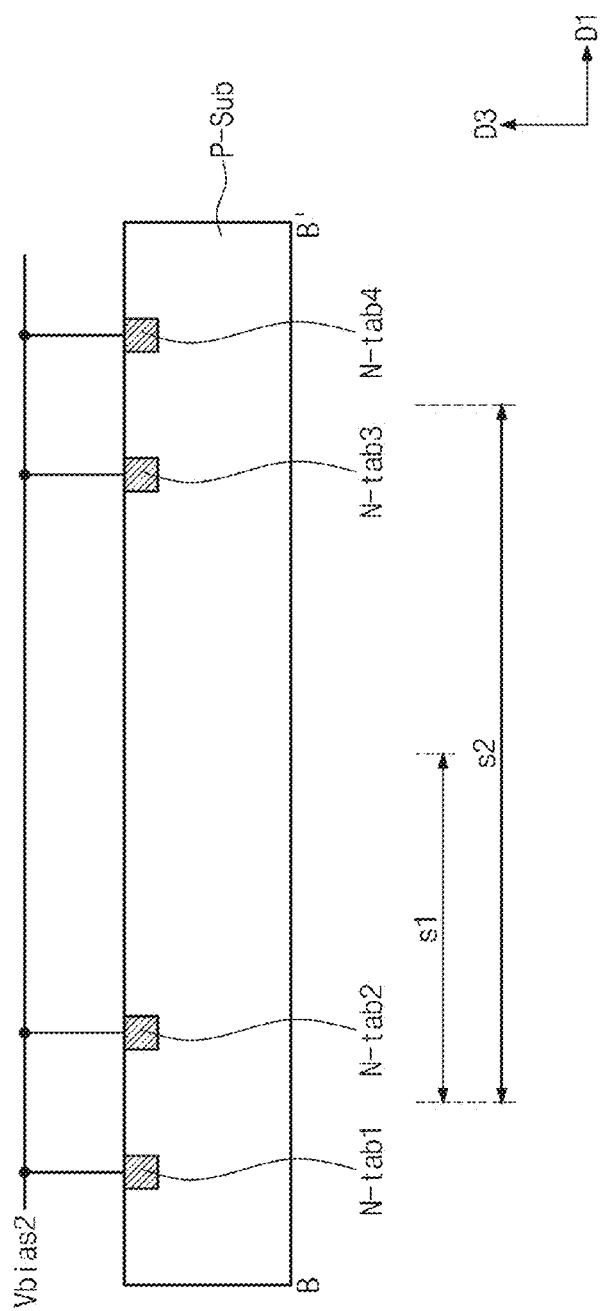
FIG. 7 is a sectional view taken along line B-B' of FIG. 6 according to an exemplary embodiment of the present inventive concept.

FIG. 6 is a plan view illustrating a power gate switching system 200 according to an exemplary embodiment of the inventive concept. FIG. 7 is a sectional view taken along line B-B' of FIG. 6 according to an exemplary embodiment of the inventive concept. The sectional view taken along line A-A' of FIG. 6 will be omitted from FIG. 7, because it is substantially the same as that of FIG. 2.

Referring to FIGS. 6 and 7, the power gate switching system 200 may include the p-type substrate P-sub in which the N-well may be formed.

The power gate switching system 200 may include a first diffusion region 201, a second diffusion region 202, a third diffusion region 203, a fourth diffusion region 204, a fifth diffusion region 205, and a sixth diffusion region 206, which are formed in the N-well. The power gate switching system 200 may include the first gate electrode G1, which is formed on the N-well and between the first and second diffusion regions 201 and 202, the second gate electrode G2, which is formed on the N-well and between the third and fourth diffusion regions 203 and 204, and the third gate electrode G3, which is formed on the N-well and between the fifth and sixth diffusion regions 205 and 206.

For example, the distance (e.g., s1) between the first and third gate electrodes G1 and G3 may be half the distance (e.g., s2) between the first and second gate electrodes G1 and G2. However, the distance (e.g., s1) between the first and third gate electrodes G1 and G3 may range from ¼ times to ¾ times the distance (e.g., s2) between the first and second gate electrodes G1 and G2. In an exemplary embodiment of the inventive concept, to allow the third channel to be formed at an overlapping region between the third gate electrode G3 and the N-well, the fifth and sixth diffusion regions 205 and 206 may be disposed at positions that are appropriately adjusted in consideration of a position of the third gate electrode G3.

For example, the first to sixth diffusion regions 201 to 206 may be doped with p-type impurities. The power voltage $V_{DD}$ (e.g., of FIG. 2) may be supplied to the first diffusion region 201, the third diffusion region 203, and the fifth diffusion region 205. Depending on the voltage Gate_CTRL to be applied to the first, second, and third gate electrodes G1, G2, and G3, the power voltage $V_{DD}$ applied to the first, third, and fifth diffusion regions 201, 203, and 205 may be used as the virtual power voltage Virtual_$V_{DD}$ to be output through the second, fourth, and sixth diffusion regions 202, 204, and 206.

For example, a size of each of the fifth and sixth diffusion regions 205 and 206 may be smaller than that of each of the first to fourth diffusion regions 201 to 204. In addition, the size of the third gate electrode G3 (e.g., a width in the first direction D1) may be smaller than the size of the first or second gate electrode G1 or G2 (e.g., a width in the first direction D1).

The power gate switching system 200 may include the first to fourth p-tabs P-tab1 to P-tab4, which are provided in the N-well. The first to fourth p-tabs P-tab1 to P-tab4 may extend in the second direction D2 and may be spaced apart from each other in the first direction D1. The first p-tab P-tab1 may be adjacent to the first diffusion region 201. The second p-tab P-tab2 may be adjacent to the second diffusion region 202. The third p-tab P-tab3 may be adjacent to the third diffusion region 203. The fourth p-tab P-tab4 may be adjacent to the fourth diffusion region 204. The p-tabs are illustrated to be not in direct contact with the diffusion regions, but in an exemplary embodiment of the inventive concept, the p-tabs may be in direct contact with the diffusion region.

For example, the first to fourth p-tabs P-tab1 to P-tab4 may be doped with n-type impurities and may have a doping concentration different from that of the N-well. The bias voltage Vbias (e.g., of FIG. 2) may be applied to the first to fourth p-tabs P-tab1 to P-tab4 to prevent an occurrence of the latch-up phenomena.

The power gate switching system 200 may further include first to fourth n-tabs N-tab1 to N-tab4, which are formed in the p-type substrate P-sub to extend in the second direction D2 and to be spaced apart from each other in the first direction D1. In the p-type substrate P-sub, the first n-tab N-tab1 may be parallel to the second direction D2 and coaxial with the first p-tab P-tab1. In the p-type substrate P-sub, the second n-tab N-tab2 may be parallel to the second direction D2 and coaxial with the second p-tab P-tab2. In the p-type substrate P-sub, the third n-tab N-tab3 may be parallel to the second direction D2 and coaxial with the third p-tab P-tab3. In the p-type substrate P-sub, the fourth n-tab N-tab4 may be parallel to the second direction D2 and coaxial with the fourth p-tab P-tab4.

For example, the first to fourth n-tabs N-tab1 to N-tab4 may be doped with p-type impurities, and the first to fourth n-tabs N-tab1 to N-tab4 may have doping concentrations that are different from that of the p-type substrate P-sub. A bias voltage Vbias2 may be applied to the first to fourth n-tabs N-tab1 to N-tab4 to prevent an occurrence of the latch-up phenomena. In an exemplary embodiment of the inventive concept, the bias voltage Vbias2 applied to the first to fourth n-tabs N-tab1 to N-tab4 may be a ground voltage.

As shown in FIG. 6, the first to fourth n-tabs N-tab1 to N-tab4 may be spaced apart from the first to fourth p-tabs P-tab1 to P-tab4. However, each of the first to fourth n-tabs N-tab1 to N-tab4 may be in contact with a corresponding one of the first to fourth p-tabs P-tab1 to P-tab4 at a boundary between the p-type substrate P-sub and the N-well.

The distance between the second and third p-tabs P-tab2 and P-tab3 and the distance between the second and third n-tabs N-tab2 and N-tab3 may be determined in consideration of a doping concentration of the N-well, a doping concentration of the p-type substrate P-sub or a combination thereof. For example, the distance between the second and third p-tabs P-tab2 and P-tab3 and the distance between the second and third n-tabs N-tab2 and N-tab3 may be within a range capable of preventing an occurrence of the latch-up phenomena in the power gate switching system 200.

Similar to that described with reference to FIG. 3, the p-tabs may consist of only the first and third p-tabs P-tab1 and P-tab3 or only the first and fourth p-tabs P-tab1 and P-tab4. Further, the n-tabs may consist of only the first and third n-tabs N-tab1 and N-tab3 or only the first and fourth n-tabs N-tab1 and N-tab4. In addition, the power gate switching system 200 may further include a plurality of device isolation layers STI, as shown in FIGS. 4 and 5.

Referring back to FIG. 6, a plurality of standard cells STD Cells may be provided between the second and third p-tabs P-tab2 and P-tab3 and between the second and third n-tabs N-tab2 and N-tab3. The virtual power voltage Virtual_$V_{DD}$ and a ground voltage $V_{SS}$ may be supplied to the plurality of standard cells STD Cells. In the case where the virtual power voltage Virtual_$V_{DD}$ is output through the second and fourth diffusion regions 202 and 204, the virtual power voltage Virtual_$V_{DD}$ may be sufficiently supplied to some of the plurality of standard cells STD Cells that are disposed adjacent to the second and fourth diffusion regions 202 and 204. However, the virtual power voltage Virtual_$V_{DD}$ may be insufficiently supplied to some of the standard cells STD Cells that are located between the second and fourth diffusion regions 202 and 204. For the standard cells, to which the virtual power voltage Virtual_$V_{DD}$ is insufficiently supplied, the fifth and sixth diffusion regions 205 and 206 and the third gate electrode G3 may be further provided. In this case, the virtual power voltage Virtual_$V_{DD}$ output through the sixth diffusion region 206 may be supplied to neighboring standard cells, and thus, those standard cells located closer to a mid-point between the second and fourth diffusion regions 202 and 204 can be stably operated.

According to an exemplary embodiment of the inventive concept, the additional supply of the virtual power voltage Virtual_$V_{DD}$ may be achieved by providing the fifth and sixth diffusion regions 205 and 206 and the third gate electrode G3, without any addition of the p-tab. Thus, it is possible to efficiently and stably supply the virtual power voltage Virtual_$V_{DD}$ to the standard cells STD Cells, without an increase in a chip size.

Figure 8:
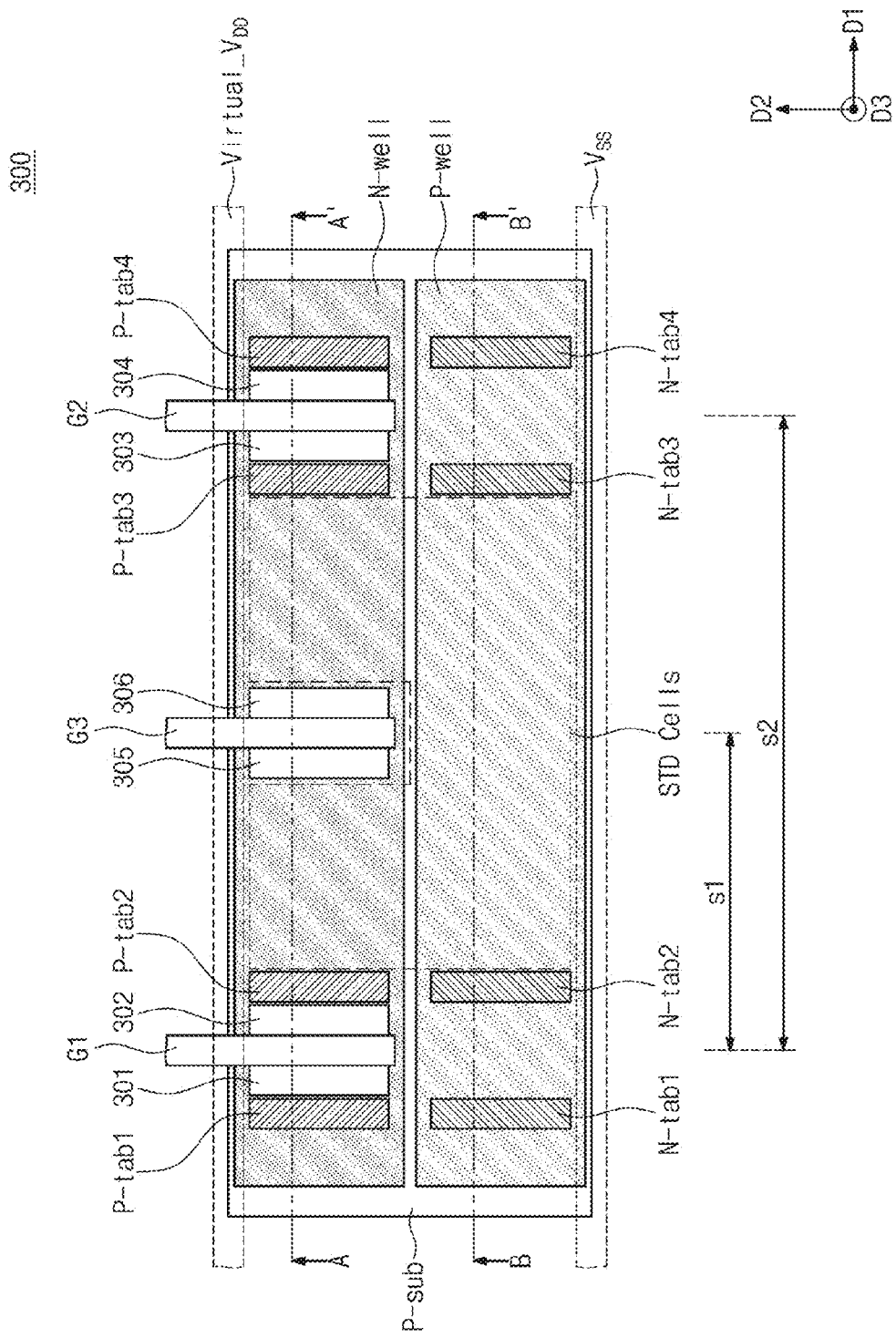
FIG. 8 is a plan view illustrating a power gate switching system according to an exemplary embodiment of the present inventive concept.
Figure 9:
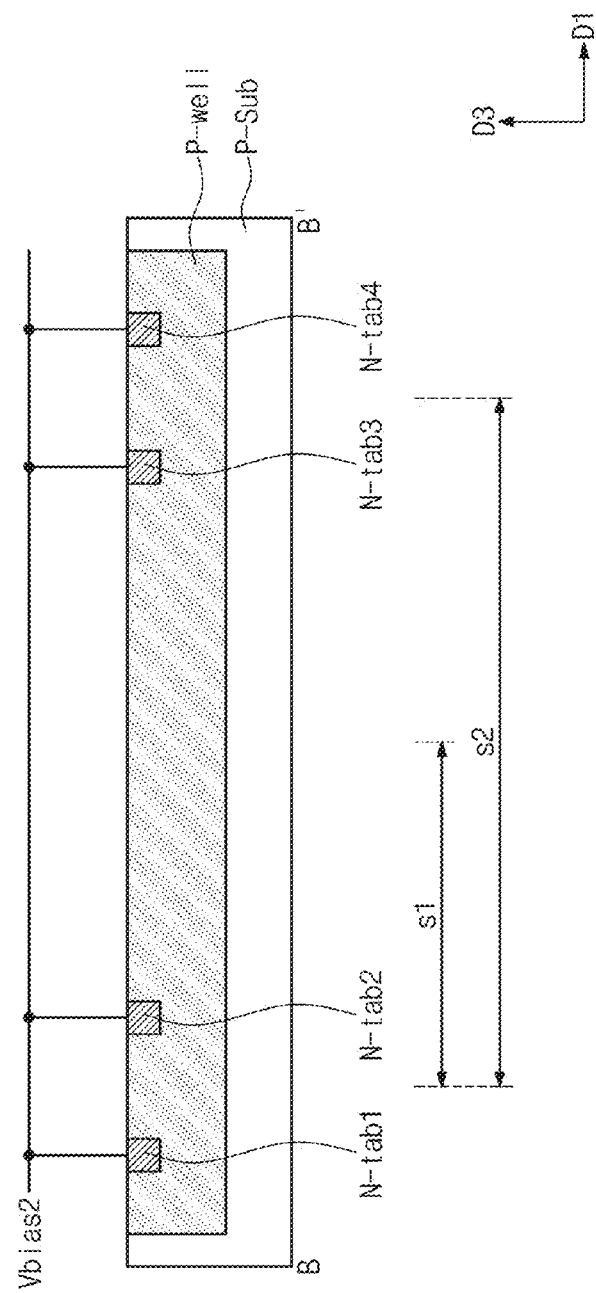
FIG. 9 is a sectional view taken along line B-B' of FIG. 8 according to an exemplary embodiment of the present inventive concept.

FIG. 8 is a plan view illustrating a power gate switching system 300 according to an exemplary embodiment of the inventive concept. FIG. 9 is a sectional view taken along line B-B' of FIG. 8 according to an exemplary embodiment of the inventive concept. The sectional view taken along line A-A' of FIG. 8 will be omitted from FIG. 9, because it is substantially the same as that of FIG. 2.

Referring to FIGS. 8 and 9, the N-well may be formed in the p-type substrate P-sub to extend in the first direction D1. A P-well extending in the first direction D1 may be formed adjacent to the N-well in the second direction D2. As shown in FIG. 8, the N-well and the P-well may be spaced apart from each other in the second direction D2, but in an exemplary embodiment of the inventive concept, the N-well and the P-well may be in contact with each other in the second direction D2. In the current embodiment of FIG. 8, the N-well and the P-well may provided in the same substrate, thereby forming a pocket well. As an example, a P-well region may surround an N-well region. It is to be understood that the pocket well may be applied to the exemplary embodiments provided in this disclosure.

First to sixth diffusion regions 301 to 306 and the first to fourth p-tabs P-tab1 to P-tab4 may be formed in the N-well, and the first to third gate electrodes G1 to G3 may be formed on the N-well. For example, the first to sixth diffusion regions 301 to 306, the first to fourth p-tabs P-tab1 to P-tab4, and the first to third gate electrodes G1 to G3 may be configured to have substantially the same features as those described with reference to FIGS. 6 to 7, and thus, a detailed description thereof will be omitted.

As shown in FIGS. 8 and 9, the first to fourth n-tabs N-tab1 to N-tab4, which extend in the second direction D2 and are spaced apart from each other in the first direction D1, may be provided in the P-well. In the P-well, the first n-tab N-tab1 may be parallel to the second direction D2 and coaxial with the first p-tab P-tab1. In the P-well, the second n-tab N-tab2 may be parallel to the second direction D2 and coaxial with the second p-tab P-tab2. In the P-well, the third n-tab N-tab3 may be parallel to the second direction D2 and coaxial with the third p-tab P-tab3. In the P-well, the fourth n-tab N-tab4 may be parallel to the second direction D2 and coaxial with the fourth p-tab P-tab4.

In an exemplary embodiment of the inventive concept, the first to fourth n-tabs N-tab1 to N-tab4 may be doped with p-type impurities, and doping concentrations of the first to fourth n-tabs N-tab1 to N-tab4 may be different from that of the P-well. The bias voltage Vbias2 may be applied to the first to fourth n-tabs N-tab1 to N-tab4 to prevent an occurrence of the latch-up phenomena. In an exemplary embodiment of the inventive concept, the bias voltage Vbias2 applied to the first to fourth n-tabs N-tab1 to N-tab4 may be a ground voltage.

As shown in FIG. 8, the first to fourth n-tabs N-tab1 to N-tab4 may be spaced apart from the first to fourth p-tabs P-tab1 to P-tab4. However, the N-well and the P-well may be in contact with each other, and each of the first to fourth n-tabs N-tab1 to N-tab4 may be in contact with a corresponding one of the first to fourth p-tabs P-tab1 to P-tab4 at a boundary between the N-well and the P-well.

The distance between the second and third p-tabs P-tab2 and P-tab3 and the distance between the second and third n-tabs N-tab2 and N-tab3 may be determined in consideration of a doping concentration of the N-well, a doping concentration of the P-well or a combination thereof. For example, the distance between the second and third p-tabs P-tab2 and P-tab3 and the distance between the second and third n-tabs N-tab2 and N-tab3 may be within a range capable of preventing an occurrence of the latch-up phenomena in the power gate switching system 300.

Similar to that described with reference to FIG. 3, the p-tabs may consist of only the first and third p-tabs P-tab1 and P-tab3 or only the first and fourth p-tabs P-tab1 and P-tab4. Further, the n-tabs may consist of only the first and third n-tabs N-tab1 and N-tab3 or only the first and fourth n-tabs N-tab1 and N-tab4. In addition, the power gate switching system 300 may further include a plurality of device isolation layers STI, as shown in FIGS. 4 and 5.

Figure 10:
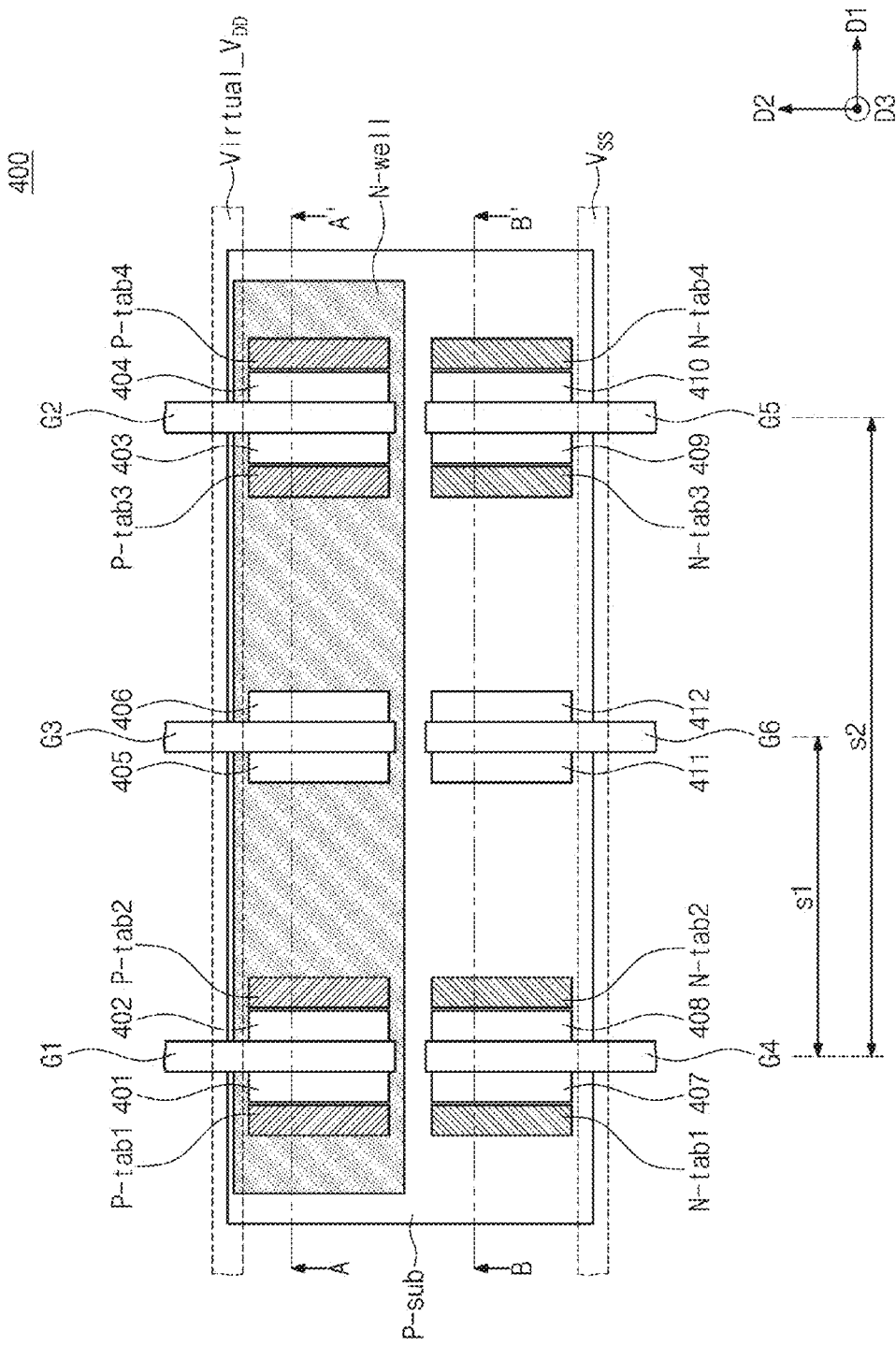
FIG. 10 is a plan view illustrating a power gate switching system according to an exemplary embodiment of the present inventive concept.
Figure 11:
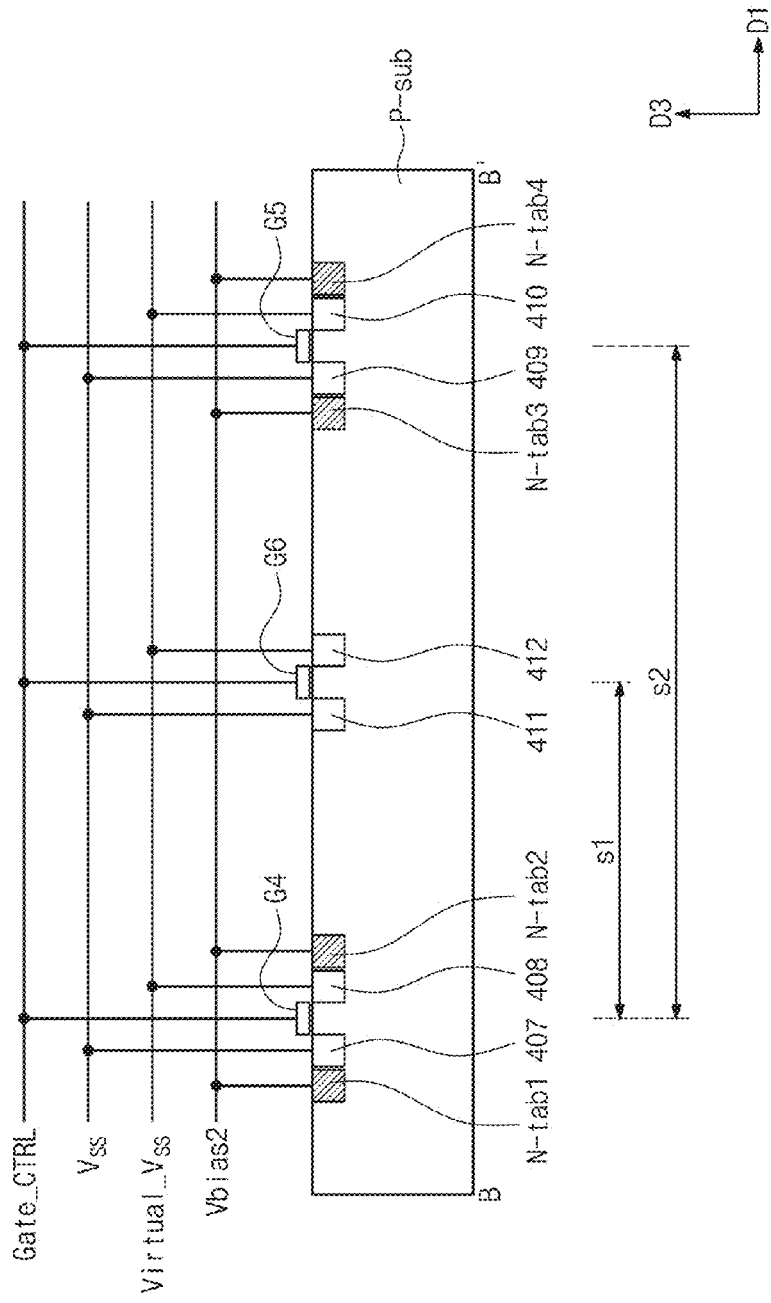
FIG. 11 is a sectional view taken along line B-B' of FIG. 10 according to an exemplary embodiment of the present inventive concept.

FIG. 10 is a plan view illustrating a power gate switching system 400 according to an exemplary embodiment of the inventive concept. FIG. 11 is a sectional view taken along line B-B' of FIG. 10 according to an exemplary embodiment of the inventive concept. The sectional view taken along line A-A' of FIG. 10 will be omitted from FIG. 11, because it is substantially the same as that of FIG. 2.

Referring to FIGS. 10 and 11, the power gate switching system 400 will be described in detail below. The power gate switching system 400 may include the N-well, which is formed to extend in the first direction D1, first to sixth diffusion regions 401 to 406 and the first to fourth p-tabs P-tab1 to P-tab4, which are formed in the N-well, and the first to third gate electrodes G1 to G3, which are formed on the N-well. The first to sixth diffusion regions 401 to 406 may be doped with p-type impurities, and the first to fourth p-tabs P-tab1 to P-tab4 may be doped with n-type impurities. The first to fourth p-tabs P-tab1 to P-tab4 may have doping concentrations that are different from that of the N-well.

The distance between the first and second gate electrodes G1 and G2 may be determined in consideration of a doping concentration of the N-well. In other words, the first and second gate electrodes G1 and G2 may be spaced apart from each other by a distance capable of preventing an occurrence of the latch-up phenomena in the power gate switching system 400. For example, the distance s1 between the first and third gate electrodes G1 and G3 may range from ¼ times to ¾ times the distance s2 between the first and second gate electrodes G1 and G2.

The elements provided in or on the N-well may have substantially the same features as those described with reference to FIGS. 1, 2, and 6, and thus, a detailed description thereof will be omitted.

The power gate switching system 400 may include seventh to twelfth diffusion regions 407 to 412, which are formed in the p-type substrate P-sub to extend in the second direction D2 and to be spaced apart from each other in the first direction D1. The first and seventh diffusion regions 401 and 407 may be formed to be coaxial with each other, thereby forming a column. The seventh diffusion region 407 may be doped with n-type impurities. Similarly, each of the eighth to twelfth diffusion regions 408 to 412 may be formed to be coaxial to a corresponding one of the second to sixth diffusion regions 402 to 406, thereby forming individual columns.

A fourth gate electrode G4 may be formed on the p-type substrate P-sub and between the seventh and eighth diffusion regions 407 and 408. A fifth gate electrode G5 may be formed on the p-type substrate P-sub and between the ninth and tenth diffusion regions 409 and 410. A sixth gate electrode G6 may be formed on the p-type substrate P-sub and between the eleventh and twelfth diffusion regions 411 and 412. Insulating layers may be further provided between the fourth, fifth, and sixth gate electrodes G4, G5, and G6 and the p-type substrate P-sub. For example, the seventh to twelfth diffusion regions 407 to 412 may be doped with n-type impurities.

The first and second n-tabs N-tab1 and N-tab2 may be formed in the p-type substrate P-sub adjacent to the seventh and eighth diffusion regions 407 and 408, respectively. Although the first and second n-tabs N-tab1 and N-tab2 are illustrated to be not in direct contact with the seventh and eighth diffusion regions 407 and 408, the first and second n-tabs N-tab1 and N-tab2 may be in direct contact with the seventh and eighth diffusion regions 407 and 408, respectively. The first to fourth n-tabs N-tab1 to N-tab4 may be doped with p-type impurities. The first to fourth n-tabs N-tab1 to N-tab4 may have doping concentrations that are different from that of the p-type substrate P-sub.

The ground voltage $V_{SS}$ may be applied to the seventh diffusion region 407. Depending on the voltage Gate_CTRL applied to the fourth gate electrode G4, the ground voltage $V_{SS}$ may be used as the virtual ground voltage Virtual_$V_{SS}$ to be output through the eighth diffusion region 408. The virtual ground voltage Virtual_$V_{SS}$ may be supplied to at least one standard cell located adjacent thereto. The ground voltage $V_{SS}$ may also be supplied to at least one standard cell located adjacent thereto.

To prevent the occurrence of the latch-up phenomena in the power gate switching system 400, the bias voltage Vbias2 may be applied to the first and second n-tabs N-tab1 and N-tab2. Although the bias voltage Vbias2 is shown to be separately applied to the first and second n-tabs N-tab1 and N-tab2, the ground voltage $V_{SS}$ may be applied to the first and second n-tabs N-tab1 and N-tab2 in its place.

The third and fourth n-tabs N-tab3 and N-tab4 may be formed in the p-type substrate P-sub adjacent to the ninth and tenth diffusion regions 409 and 410, respectively. Although the third and fourth n-tabs N-tab3 and N-tab4 are illustrated to be not in direct contact with the ninth and tenth diffusion regions 409 and 410, respectively, the third and fourth n-tabs N-tab3 and N-tab4 may be formed in direct contact with the ninth and tenth diffusion regions 409 and 410, respectively.

The ground voltage $V_{SS}$ may be applied to the ninth diffusion region 409. Depending on the voltage Gate_CTRL applied to the fifth gate electrode G5, the ground voltage $V_{SS}$ may be used as the virtual ground voltage Virtual_$V_{SS}$ to be output through the tenth diffusion region 410. The virtual ground voltage Virtual_$V_{SS}$ may be supplied to at least one standard cell located adjacent thereto. The ground voltage $V_{SS}$ may also be supplied to at least one standard cell located adjacent thereto.

The bias voltage Vbias2 may be applied to the third and fourth n-tabs N-tab3 and N-tab4. Although the bias voltage Vbias2 is shown to be separately applied to the third and fourth n-tabs N-tab3 and N-tab4, the ground voltage $V_{SS}$ may be applied to the third and fourth n-tabs N-tab3 and N-tab4 in its place.

In the case where the virtual ground voltage Virtual_$V_{SS}$ is output through the eighth diffusion region 408 or the tenth diffusion region 410, the virtual ground voltage Virtual_$V_{SS}$ may be sufficiently supplied to standard cells adjacent to the eighth or tenth diffusion region 408 or 410. However, the virtual ground voltage Virtual_$V_{SS}$ may be insufficiently supplied to other standard cells located between the eighth and tenth diffusion regions 408 and 410. For such standard cells, to which the virtual ground voltage Virtual_$V_{SS}$ is insufficiently supplied, the eleventh and twelfth diffusion regions 411 and 412 and the sixth gate electrode G6 may be further provided.

For example, a size of the eleventh and twelfth diffusion regions 411 and 412 (e.g., a width in the first direction D1) may be smaller than that of the seventh to tenth diffusion regions 407 to 410 (e.g., a width in the first direction D1). A size of the sixth gate electrode G6 (e.g., a width in the first direction D1) may also be smaller than that of the fourth or fifth gate electrode G4 or G5 (e.g., a width in the first direction D1).

According to an exemplary embodiment of the inventive concept, since the fifth and sixth diffusion regions 405 and 406, the third gate electrode G3, the eleventh and twelfth diffusion regions 411 and 412, and the sixth gate electrode G6 are provided, it is possible to stably supply the virtual power voltage Virtual_$V_{DD}$ to standard cells located on a weak region (e.g., between the diffusion regions 402 and 404 or the diffusion regions 408 and 410), to which the virtual ground voltage Virtual_$V_{SS}$ is insufficiently supplied. In addition, by adding relatively small components without an addition of the p-tab or n-tab, it is possible to decrease the size of a semiconductor chip.

Figure 12:
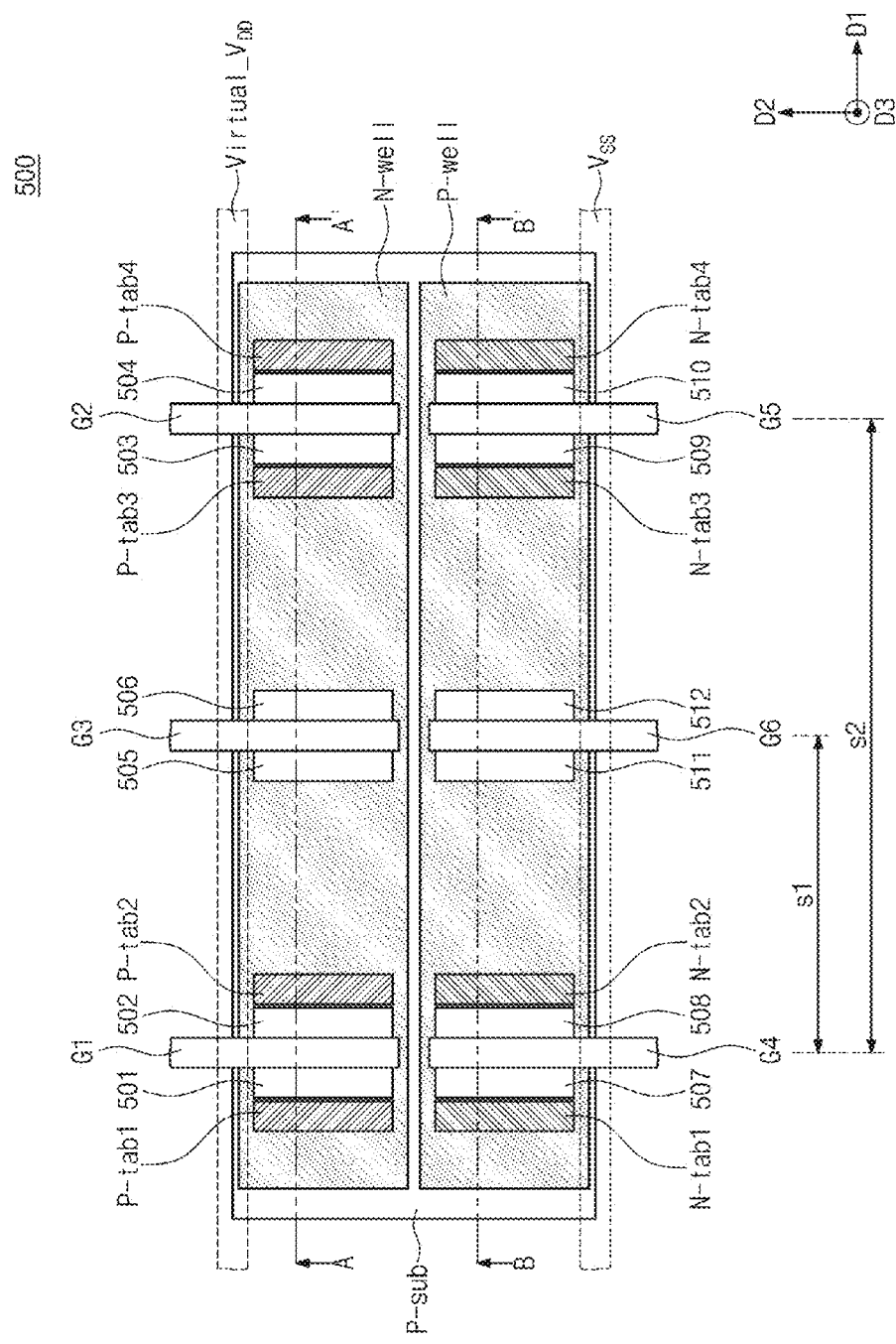
FIG. 12 is a plan view illustrating a power gate switching system according to an exemplary embodiment of the present inventive concept.
Figure 13:
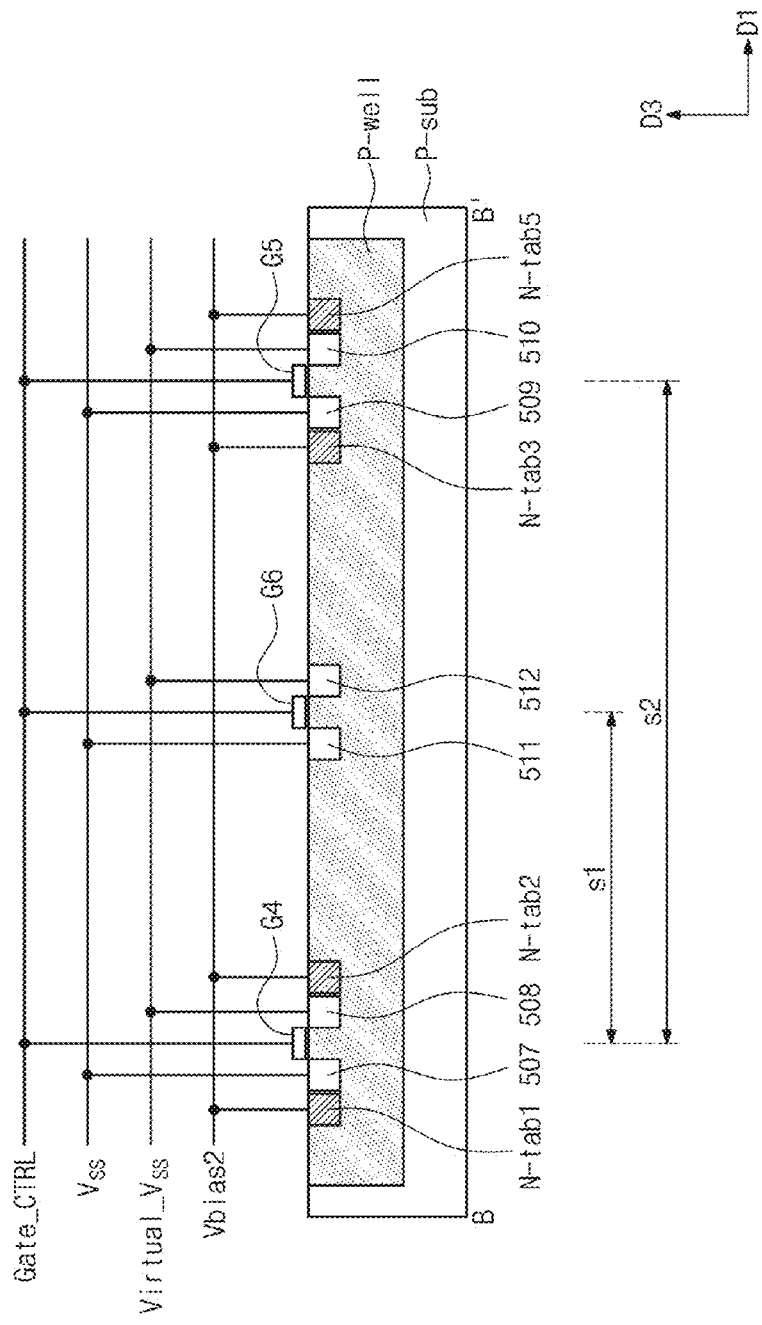
FIG. 13 is a sectional view taken along line B-B' of FIG. 12 according to an exemplary embodiment of the present inventive concept.

FIG. 12 is a plan view illustrating a power gate switching system 500 according to an exemplary embodiment of the inventive concept. FIG. 13 is a sectional view taken along line B-B' of FIG. 12 according to an exemplary embodiment of the inventive concept. The sectional view taken along line A-A' of FIG. 12 will be omitted from FIG. 13, because it is substantially the same as that of FIG. 2.

Referring to FIGS. 12 and 13, the power gate switching system 500 will be described in detail below. The power gate switching system 500 of FIGS. 12 and 13 may include the p-type substrate P-sub, in which the N-well and the P-well are formed. The N-well and the P-well may be adjacent to each other in the second direction D2 and may extend in the first direction D1. In the current embodiment of FIG. 12, the N-well and the P-well may provided in the same substrate, thereby forming a pocket well.

The power gate switching system 500 may include seventh to twelfth diffusion regions 507 to 512 and the first to fourth n-tabs N-tab1 to N-tab4, which are formed in the P-well, and the fourth to sixth gate electrodes G4 to G6, which are formed on the P-well. Except for this, the power gate switching system 500 may be similar to that of FIGS. 10 and 11. For example, the power gate switching system 500 may include first to sixth diffusion regions 501 to 506 and the first to fourth p-tabs P-tab1 to P-tab4, which are formed in the N-well, and the first to third gate electrodes G1 to G3, which are formed on the N-well. Thus, a detailed description thereof will be omitted.

In an exemplary embodiment of the inventive concept, the distance s1 between the first and third gate electrodes G1 and G3 may range from ¼ to ¾ times the distance s2 between the first and second gate electrodes G1 and G2, and the distance s1 between the fourth and sixth gate electrodes G4 and G6 may range from ¼ to ¾ times the distance s2 between the fourth and fifth gate electrodes G4 and G5. A size (e.g., a width in the first direction D1) of each of the diffusion regions 505, 506, 511, and 512 may be smaller than a size (e.g., a width in the first direction D1) of each of the diffusion regions 501 to 504 or 507 to 510. A size (e.g., a width in the first direction D1) of each of the gate electrodes G3 and G6 may also be smaller than a size (e.g., a width in the first direction D1) of each of the gate electrodes G1, G2, G4, and G5.

Figure 14:
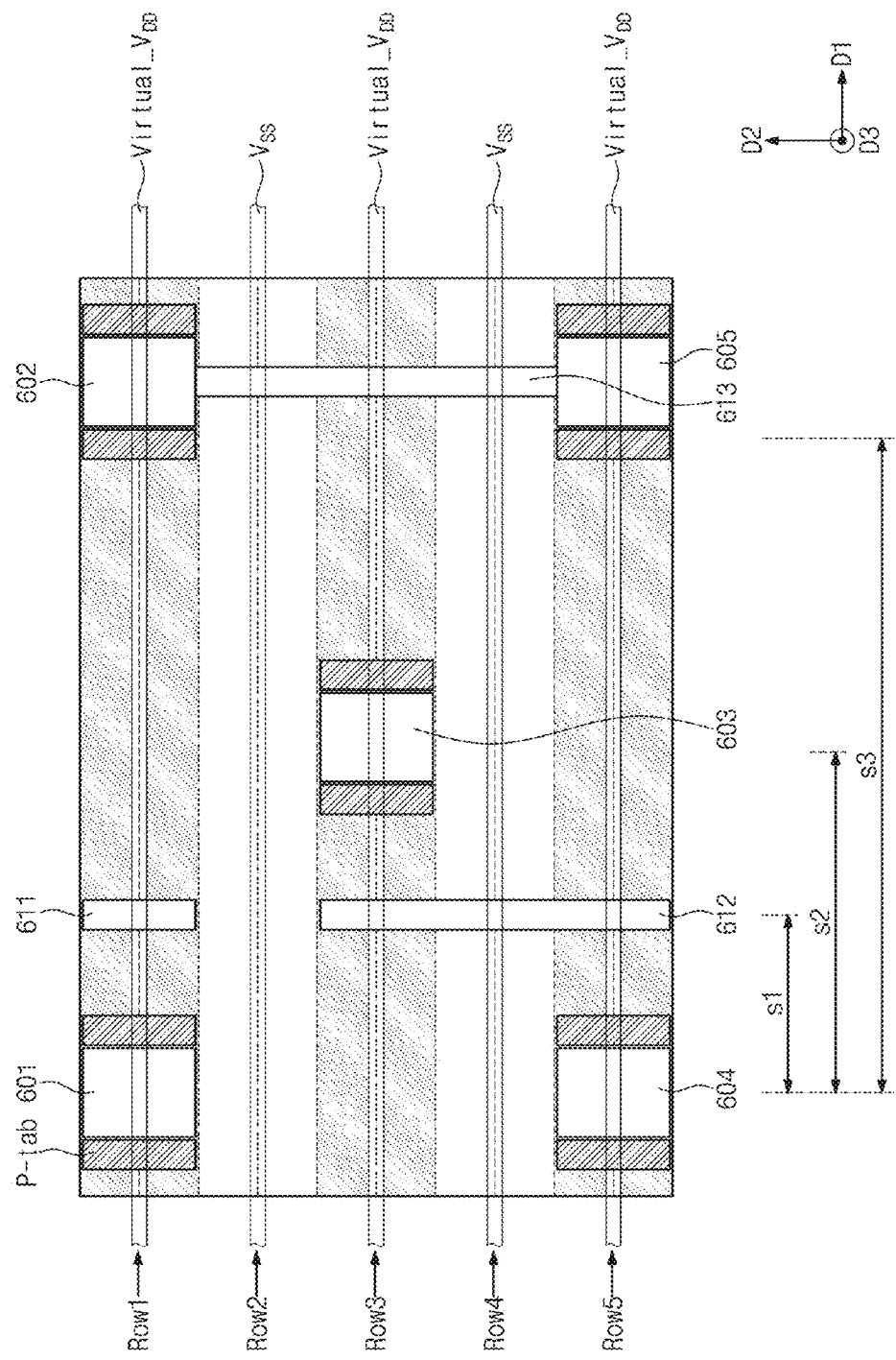
FIG. 14 is a plan view illustrating a layout of a semiconductor device that is applied to a power gate switching system according to an exemplary embodiment of the present inventive concept.

FIG. 14 is a plan view illustrating a layout of a semiconductor device that is applied to a power gate switching system according to an exemplary embodiment of the inventive concept. For the sake of brevity, the device isolation layer (e.g., STI of FIG. 4) is omitted from FIG. 14.

Referring to FIG. 14, a plurality of N-wells, which extend in a first direction D1 and are spaced apart from each other in a second direction D2, may be formed in a p-type substrate P-sub. For example, the N-wells may extend parallel to a first row Row1, a third row Row3, and a fifth row Row5. In FIG. 14, the N-wells are shown by the cross-hatching. As shown in FIG. 14, virtual power lines Virtual_$V_{DD}$ may be disposed to cross the N-wells in the first direction D1, and ground lines $V_{SS}$ may be disposed to cross the p-type substrate P-sub in the first direction D1. A distance between the virtual power line Virtual_$V_{DD}$ and the ground line $V_{SS}$ measured in the second direction D2 will be referred to as 1 H.

Various standard cells constituting a semiconductor logic circuit and a power gate switch system for supplying the virtual power Virtual_$V_{DD}$ to the standard cells may be disposed on the p-type substrate P-sub and the N-well. The power gate cell and p-tabs adjacent thereto may be uniformly disposed by using a layout design tool.

For example, a first cell 601 may be overlapped with the N-well located on the first row Row1. The first cell 601 may include at least one gate electrode and at least two diffusion regions. The at least two diffusion regions of the first cell 601 may be regions that are doped with p-type impurities.

Two p-tabs may be provided adjacent to the first cell 601. As shown in FIG. 14, the two p-tabs may be in direct contact with the first cell 601 or not in direct contact with the first cell 601. Although two p-tabs are illustrated, the p-tab may be singly formed, as described above. For example, the p-tab may be doped with n-type impurities, and a doping concentration of the p-tab may be different from that of the N-well.

A second cell 602 may be spaced apart from the first cell 601 by a distance of s3 and overlapped with the N-well located on the first row Row1. Similar to the first cell 601, the second cell 602 may include at least one gate electrode and at least two diffusion regions. The distance (e.g., s3) between the first and second cells 601 and 602 may be determined in consideration of the doping concentration of the N-well. For example, the first and second cells 601 and 602 may be spaced apart from each other by a distance capable of preventing an occurrence of the latch-up phenomena. The second and first cells 602 and 601 may be configured to have substantially the same features, except for their positions, and thus, a detailed description thereof will be omitted.

A third cell 603 may be overlapped with the N-well located on the third row Row3. As shown in FIG. 14, the third cell 603 may be positioned between the first and second cells 601 and 602. The third and first cells 603 and 601 may be configured to have substantially the same features, except for their positions, and thus, a detailed description thereof will be omitted.

A fourth cell 604 and a fifth cell 605 may be overlapped with the N-well located on the fifth row Row5. The fourth, fifth, and first cells 604, 605, and 601 may be configured to have substantially the same features, except for their positions, and thus, a detailed description thereof will be omitted.

As shown in FIG. 14, even if the first to fifth cells 601 to 605 are uniformly disposed, at least one standard cell disposed between the cells may suffer from a shortage or a voltage drop of the virtual power voltage Virtual_$V_{DD}$. In the case where such a voltage drop is large, the at least one standard cell disposed between the cells may abnormally operate. By providing first to third additional cells 611 to 613, it is possible to prevent the at least one standard cell, at which the large voltage drop occurs, from being abnormally operated. For example, the voltage drop may not be large at the positions of the additional cells 611 to 613.

The first additional cell 611 may be overlapped with the N-well located on the first row Row1. The first additional cell 611 may include at least one gate electrode and at least two diffusion regions. The at least two diffusion regions of the first additional cell 611 may be doped with p-type impurities. However, unlike the first to fifth cells 601 to 605, the p-tab may not be provided in the first additional cell 611. A size of the first additional cell 611 may be smaller than that of at least one of the first to fifth cells 601 to 605. For example, a size (e.g., a width in the first direction D1) of the gate electrode of the first additional cell 611 may be equal to or smaller than that of at least one of the first to fifth cells 601 to 605. In addition, a size (e.g., a width in the first direction D1) of the diffusion region of the first additional cell 611 may be equal to or smaller than that of at least one of the first to fifth cells 601 to 605. Furthermore, the distance s1 between the first cell 601 and the first additional cell 611 may range from ¼ to ¾ times the distance s3 between the first cell 601 and the second cell 602.

The second additional cell 612 may be overlapped with the N-well located on the third and fifth rows Row3 and Row5. The second additional cell 612 may include at least one gate electrode and at least four diffusion regions. In other words, the diffusion regions of the third and fifth rows Row3 and Row5 may be configured to share the gate electrode. The at least four diffusion regions of the second additional cell 612 may be doped with p-type impurities. Unlike the first to fifth cells 601 to 605, the p-tab may not be provided in the second additional cell 612. A size of the second additional cell 612 may be equal to or smaller than that of at least one of the first to fifth cells 601 to 605. In other words, a size (e.g., a width in the first direction D1) of the gate electrode of the second additional cell 612 may be equal to or smaller than that of at least one of the first to fifth cells 601 to 605. A size (e.g., a width in the first direction D1) of the diffusion region of the second additional cell 612 may be equal to or smaller than that of at least one of the first to fifth cells 601 to 605. Although the second additional cell 612 is illustrated to have a length of 3 H in the second direction D2, the inventive concept may not be limited thereto.

The third additional cell 613 may be overlapped with the N-well located on the third row Row3. The third additional cell 613 may include at least one gate electrode and at least two diffusion regions. The third additional cell 613 and the second cell 602 may be configured to share the same gate electrode (e.g., the at least one gate electrode). The third additional cell 613 and the fifth cell 605 may be configured to share the same gate electrode (e.g., the at least one gate electrode).

The at least two diffusion regions of the third additional cell 613 may be doped with p-type impurities. Unlike the first to fifth cells 601 to 605, the p-tab may not be provided in the third additional cell 613. The third additional cell 613 may have a size that is equal to or smaller than that of at least one of the first to fifth cells 601 to 605. In other words, a size (e.g., a width in the first direction D1) of the gate electrode of the third additional cell 613 may be equal to or smaller than that of the first to fifth cells 601 to 605. A size (e.g., a width in the first direction D1) of the diffusion region of the third additional cell 613 may be equal to or smaller than that of the first to fifth cells 601 to 605.

As described with reference to FIG. 14, by providing a plurality of the cells 601 to 605 and a plurality of the additional cells 611 to 613, it is possible to sufficiently supply the virtual power voltage Virtual_$V_{DD}$ to standard cells that are disposed at regions that may suffer from a large voltage drop. In addition, since each of the additional cells 611 to 613 has a size smaller than that of each of the cells 601 to 605, it is possible to reduce a size of a semiconductor chip and to strategically dispose the standard cells.

Figure 15:
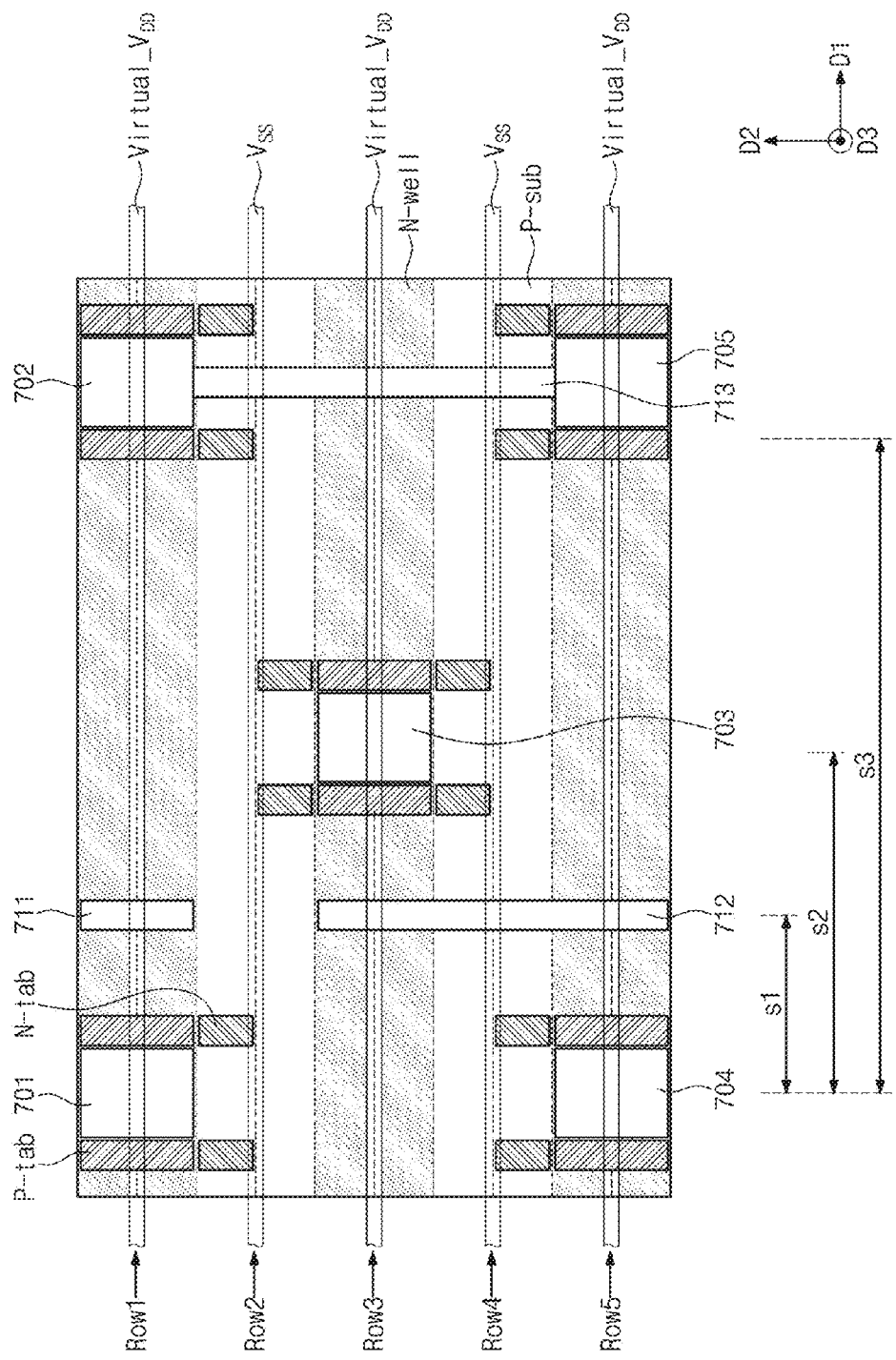
FIG. 15 is a plan view illustrating a layout of a semiconductor device that is applied to a power gate switching system according to an exemplary embodiment of the present inventive concept.

FIG. 15 is a plan view illustrating a layout of a semiconductor device that is applied to a power gate switching system according to an exemplary embodiment of the inventive concept. For the sake of brevity, the device isolation layer (e.g., STI of FIG. 4) is omitted from FIG. 15. The layout of the semiconductor device shown in FIG. 15 may be configured to have substantially the same or similar features as that of FIG. 14, except that a plurality of n-tabs are provided, and thus, elements previously described with reference to FIG. 14 may not be described again. For example, FIG. 15 shows first to fifth cells 701 to 705, which are similar to the first to fifth cells 601 to 605 of FIG. 14, and additional cells 711 to 713, which are similar to the additional cells 611 to 613 of FIG. 14.

A plurality of n-tabs may be disposed to be overlapped with the p-type substrate P-sub. For example, each of the n-tabs may be disposed to extend in the second direction D2, and at least one of the n-tabs may be adjacent to a corresponding one of the p-tabs. Although an adjacent pair of the p-tab and the n-tab are illustrated to be spaced apart from each other, they may be in direct contact with each other at a boundary between the N-well and the p-type substrate P-sub. The plurality of n-tabs may be doped with p-type impurities, and a doping concentration of the n-tabs may be different from that of the p-type substrate P-sub. Furthermore, the P-well doped with p-type impurities may be overlapped with the p-type substrate P-sub. In this case, the n-tabs may be overlapped with the P-well.

Figure 16:
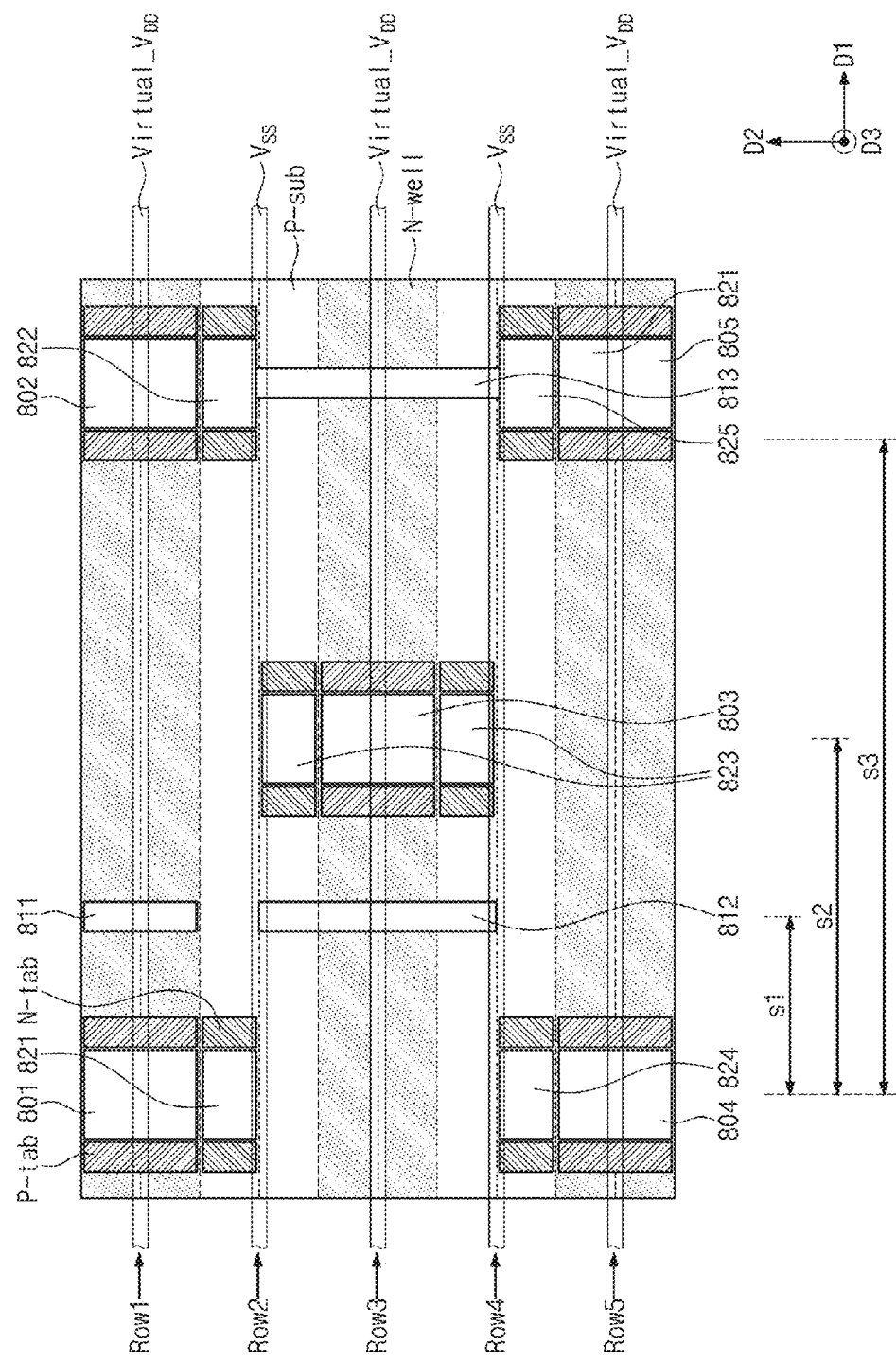
FIG. 16 is a plan view illustrating a layout of a semiconductor device that is applied to a power gate switching system according to an exemplary embodiment of the present inventive concept.

FIG. 16 is a plan view illustrating a layout of a semiconductor device that is applied to a power gate switching system according to an exemplary embodiment of the inventive concept. For the sake of brevity, the device isolation layer (e.g., STI of FIG. 4) is omitted from FIG. 16.

The semiconductor device of FIG. 16 may include elements that are overlapped with the N-well and have substantially the same features as those of FIGS. 14 and 15, and thus, a detailed description thereof will be omitted, for the sake of brevity. In addition, the semiconductor device of FIG. 16 may include the n-tabs, which are overlapped with the p-type substrate P-sub or the P-well and have substantially the same features as those of FIG. 15, and thus, a detailed description thereof will be omitted, for the sake of brevity. For example, FIG. 16 shows first to fifth cells 801 to 805, which are similar to the first to fifth cells 601 to 605 of FIG. 14.

Referring to FIG. 16, sixth to tenth cells 821 to 825 may be provided on the p-type substrate P-sub. Each of the sixth to tenth cells 821 to 825 may include at least one gate electrode and at least two diffusion regions. As shown in FIG. 16, each of the sixth to tenth cells 821 to 825 may be provided between two n-tabs.

A first additional cell 811 may be configured to have substantially the same features as the first additional cell 711 of FIG. 15, and thus, a detailed description thereof will be omitted, for the sake of brevity.

A second additional cell 812 may extend from the second row Row2 to the fourth row Row4 in the second direction D2. For example, as shown in FIG. 16, the second additional cell 812 may have a length of 2 H. The second additional cell 812 may include at least two diffusion regions formed in the p-type substrate P-sub of the second row Row2, at least two diffusion regions formed in the N-well of the third row Row3, at least two diffusion regions formed in the p-type substrate P-sub of the third row Row3, and at least one gate electrode. In this case, the diffusion regions may be configured to share the at least one gate electrode. However, in the case where two or more gate electrodes are provided, the diffusion regions may not share the single gate electrode. For example, the diffusion regions formed in the N-well may be doped with p-type impurities, and the diffusion regions formed in the p-type substrate P-sub may be doped with n-type impurities.

A third additional cell 813 may extend from the second row Row2 to the fourth row Row4 in the second direction D2. For example, as shown in FIG. 16, the second additional cell 812 may have a length of 2 H. The third additional cell 813 may include at least two diffusion regions formed in the p-type substrate P-sub of the second row Row2, at least two diffusion regions formed in the N-well of the third row Row3, at least two diffusion regions formed in the p-type substrate P-sub of the third row Row3, and at least one gate electrode.

For example, the diffusion regions of the third additional cell 813 in the second row Row2 may be configured to share the diffusion regions and the gate electrode of the seventh cell 822. Further, the diffusion regions of the third additional cell 813 in the fourth row Row4 may be configured to share the diffusion regions and the gate electrode of the tenth cell 825. In other words, at least a portion of, or the whole, of the diffusion regions of the third additional cell 813 may be configured to share the gate electrode of at least one of the seventh and tenth cells 822 and 825.

Figure 17A:
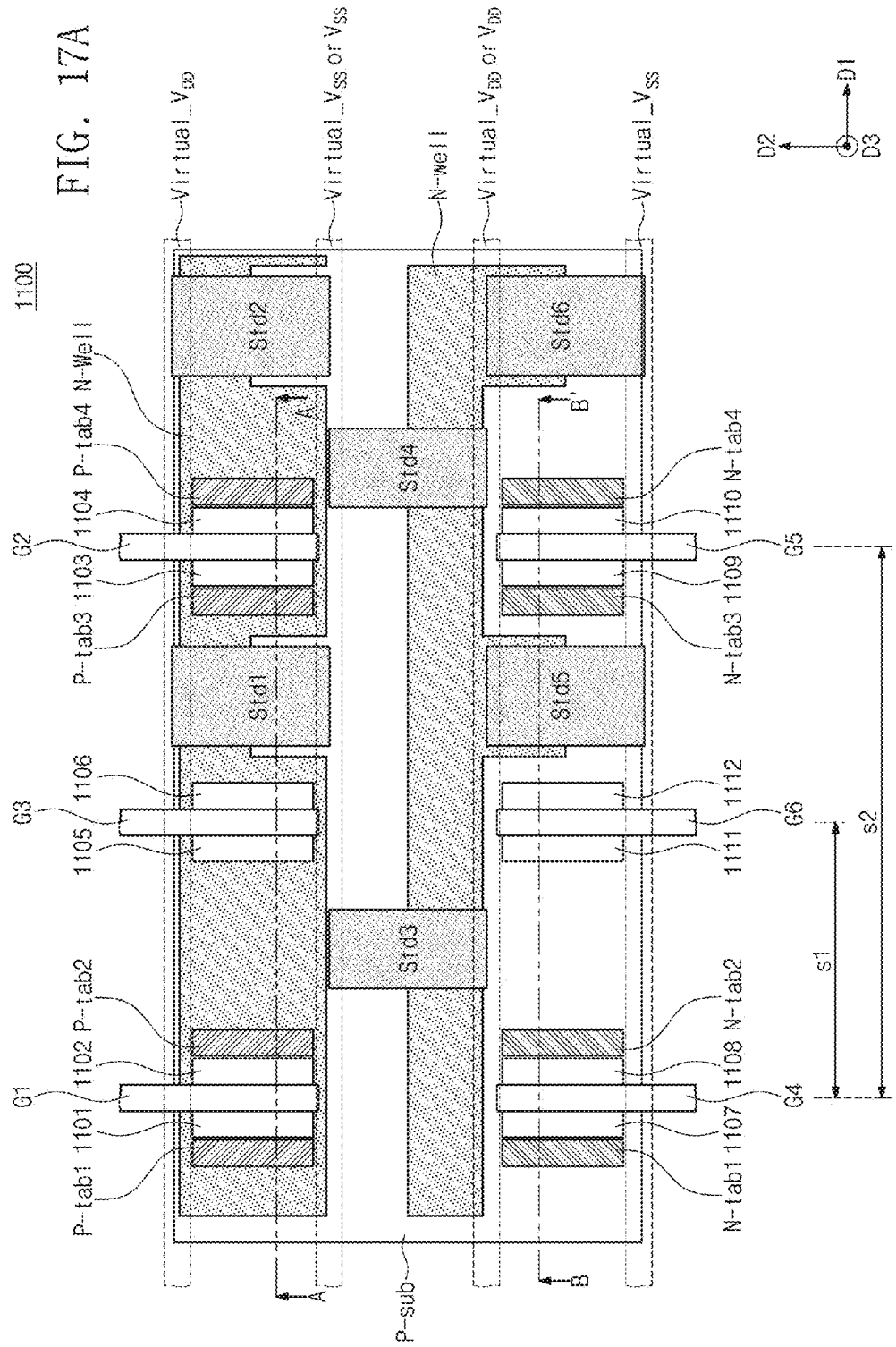
FIG. 17A is a plan view illustrating a power gate switching system according to an exemplary embodiment of the present inventive concept.

FIG. 17A is a plan view illustrating a power gate switching system according to an exemplary embodiment of the present inventive concept. The plan view of FIG. 17A is similar to that of FIG. 10. Accordingly, mainly differences between these two figures will be described.

For example, a power gate switching system 1100 may include an upper row, a middle row and a bottom row as shown in FIG. 17A.

The upper row may include a first power gate cell (P-tab1, 1101, G1, 1102, P-tab2), a second power gate cell (1105, G3, 1106) and a third power gate cell (P-tab3, 1103, G2, 1104, P-tab4) disposed between and connected to Virtual VDD and VSS (or Virtual VSS). In other words, the upper row shows PMOS power gate cells connected between Virtual VDD and VSS (or Virtual VSS). The upper row may further include a plurality of standard cells (Std1, Std2) disposed between and connected to Virtual VDD and VSS (or Virtual VSS). The plurality of standard cells (Std1, Std2) may be disposed between the PMOS power gate cells in the upper row. Each of the plurality of standard cells (Std1, Std2) may include a PMOS transistor on a N-well and a NMOS transistor on a P-sub. The N-well of the PMOS transistor of the each of the plurality of standard cells (Std1, Std2) may be merged with a N-well of the PMOS power gate cells in the upper row as shown in FIG. 17A. The shape of the merged N-well where the PMOS power gate cells are disposed may be different from the shape of the N-well in FIG. 10 because one of the plurality of standard cells (Std1, Std2) disposed between the PMOS power gate cells in the upper row includes the NMOS transistor on the P-sub.

The bottom row may include a fourth power gate cell (N-tab1, 1107, G4, 1108, N-tab2), a fifth power gate cell (1111, G6, 1112) and a sixth power gate cell (N-tab3, 1109, G5, 1110, N-tab4) disposed between and connected to Virtual VSS and VDD (or Virtual VDD). In other words, the bottom row shows NMOS power gate cells connected between Virtual VSS and Virtual VDD (or VDD). The bottom row may further include a plurality of standard cells (Std5, Std6) disposed between and connected to VDD (or Virtual VDD) and Virtual VSS. The plurality of standard cells (Std5, Std6) may be disposed between the NMOS power gate cells in the bottom row. Each of the plurality of standard cells (Std5, Std6) may include a PMOS transistor on a N-well and a NMOS transistor on the P-sub. Thus, the N-well of the PMOS transistor of the standard cells (Std5, Std6) disposed between the NMOS power gate cells in the bottom row may be disposed on the P-sub in the bottom row. The N-well of the PMOS transistor of the each of the plurality of standard cells (Std5, Std6) may be merged with a N-well of a plurality of standard cells (Std3, Std4) in the middle row as shown in FIG. 17A.

The middle row may include the standard cells (Std3, Std4) disposed between and connected to a pair of Virtual VSS and VDD, a pair of Virtual VDD and VSS, or a pair of Virtual VDD and Virtual VSS.

The power gate switching system 1100 may further include a plurality of middle rows connected to Virtual VSS or Virtual VDD. One of the plurality of middle rows may be connected to Virtual VSS that is connected to an NMOS power gate cell or may be connected to VSS. The other of the plurality of middle rows may be connected to Virtual VDD that is connected to a PMOS power gate cell or may be connected to VDD. Hereafter, the power gate cells may be referred to using their gate electrodes. Here, one of the first to sixth power gate cells may be elongated to at least one of the middle rows to provide a Virtual VDD or Virtual VSS node to the plurality of standard cells in the at least one of the middle rows.

Figure 17B:
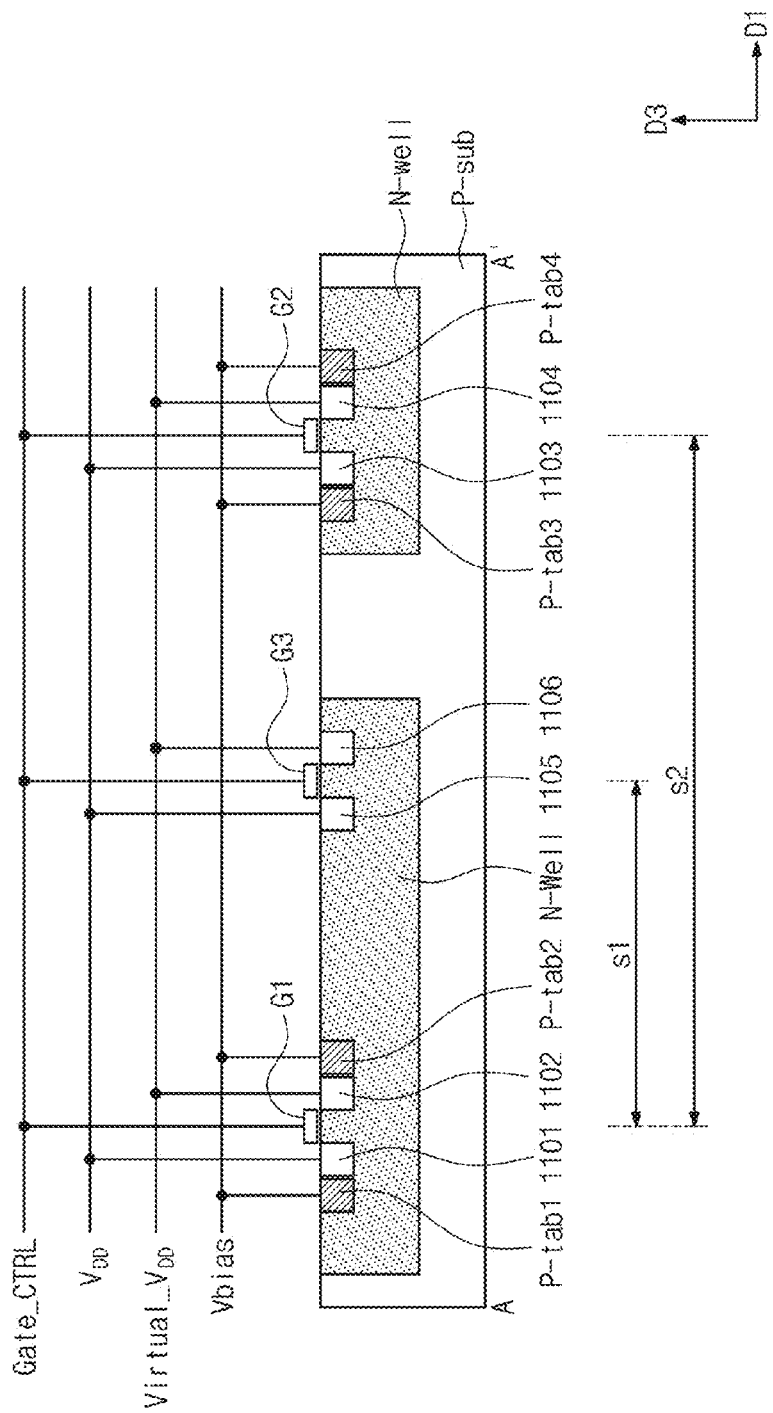
FIG. 17B is a sectional view taken along line A-A' of FIG. 17A according to an exemplary embodiment of the present inventive concept.

FIG. 17B is a sectional view taken along line A-A' of FIG. 17A according to an exemplary embodiment of the present inventive concept. The elements of FIG. 17B correspond to those of FIG. 12. Accordingly, mainly differences between these two figures will be described. For example, FIG. 17B shows a discontinued N-well extended in direction D1 on a P-sub. In other words, a break is shown in the N-well. A NMOS transistor of a standard cell may be disposed on the P-sub between power gate cells G1, G2 and G3.

Figure 17C:
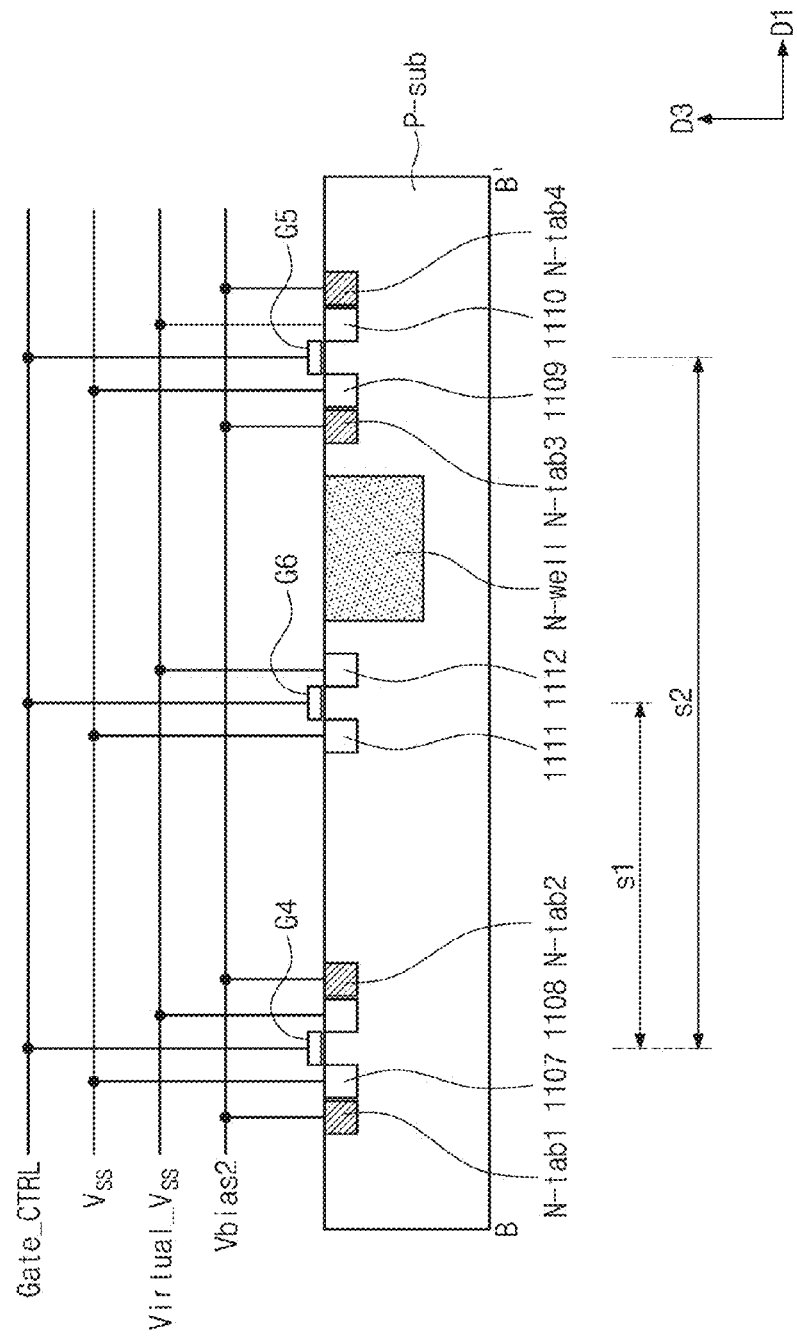
FIG. 17C is a sectional view taken along line B-B' of FIG. 17A according to an exemplary embodiment of the present inventive concept.

FIG. 17C is a sectional view taken along line B-B' of FIG. 17A according to an exemplary embodiment of the present inventive concept. The elements of FIG. 17C correspond to those of FIG. 11. Accordingly, mainly differences between these two figures will be described. For example, FIG. 17C shows the NMOS power gate cells connected to VSS and Virtual VSS. A N-well for a PMOS transistor of a standard cell may be disposed between fourth to sixth power gate cells on a P-sub. For example, the N-well is disposed between the fifth and sixth power gate cells.

FIG. 18A is a plan view illustrating a power gate switching system according to an exemplary embodiment of the present inventive concept. The plan view of FIG. 18A is similar to that of FIG. 12. Accordingly, mainly differences between these two figures will be described. It is to be understood that in the current embodiment of FIG. 18A, the N-well and the P-well may provided in the same substrate, thereby forming a pocket well.

For example, a power gate switching system 1200 may include an upper row, a middle row and a bottom row as shown in FIG. 18A.

The upper row includes a first power gate cell (P-tab1, 1201, G1, 1202, P-tab2), a second power gate cell (1205, G3, 1206) and a third power gate cell (P-tab3, 1203, G2, 1204, P-tab4) disposed between and connected to Virtual VDD and Virtual VSS (or VSS). In other words, the upper row shows PMOS power gate cells connected between Virtual VDD and Virtual VSS (or VSS). The upper row may further include a plurality of standard cells (Std1, Std2) disposed between and connected to Virtual VDD and VSS (or Virtual VSS). The plurality of standard cells (Std1, Std2) may be disposed between the PMOS power gate cells in the upper row. Each of the plurality of standard cells (Std1, Std2) may include a PMOS transistor on a N-well and a NMOS transistor on a P-well. The N-well of the PMOS transistor of the each of the plurality of standard cells (Std1, Std2) in the upper row may be merged with a N-well of the PMOS power gate cells in the upper row as shown in FIG. 18A. The shape of the merged N-well where the PMOS power cells are disposed may be different from the shape of the N-well in FIG. 12 because one of the plurality of standard cells (Std1, Std2) disposed between the first to third PMOS power gate cells includes the NMOS transistor on the P-well.

The bottom row includes a fourth power gate cell (N-tab1, 1207, G4, 1208, N-tab2), a fifth power gate cell (1211, G6, 1212) and a sixth power gate cell (N-tab3, 1209, G5, 1210, N-tab4) disposed between and connected to Virtual VSS and VDD (or Virtual VDD). In other words, the bottom row shows NMOS power gate cells connected between Virtual VSS and Virtual VDD (or VDD). The bottom row further includes a plurality of standard cells (Std5, Std6) disposed between and connected to VDD (or Virtual VDD) and Virtual VSS. The plurality of standard cells (Std5, Std6) may be disposed between the NMOS power gate cells in the bottom row. Each of the plurality of standard cells (Std5, Std6) may include a PMOS transistor on a N-well and a NMOS transistor on the P-well. Thus, the N-well of the PMOS transistor of the standard cells (Std5, Std6) disposed between the fourth to sixth NMOS power gate cells in the bottom row may be disposed on the P-sub apart from the P-well in the bottom row. The N-well of the PMOS transistor of the each of the plurality of standard cells (Std5, Std6) in the bottom row may be merged with a N-well of a plurality of standard cells (Std3, Std4) in the middle row as shown in FIG. 18A.

The middle row may include the standard cells (Std3, Std4) disposed between and connected to a pair of Virtual VSS and VDD, a pair of Virtual VDD and VSS, or a pair of Virtual VDD and Virtual VSS. The power gate switching system 1200 may further include a plurality of middle rows connected to Virtual VSS or Virtual VDD. One of the plurality of middle rows may be connected to Virtual VSS that is connected to an NMOS power gate cell or may be connected to VSS. The other of the plurality of middle rows may be connected to Virtual VDD that is connected to a PMOS power gate cell or may be connected to VDD. Here, one of the first to sixth power gate cells may be elongated to at least one of the middle rows to provide a Virtual VDD or Virtual VSS node to the plurality of standard cells in the at least one of the middle rows.

Figure 18B:
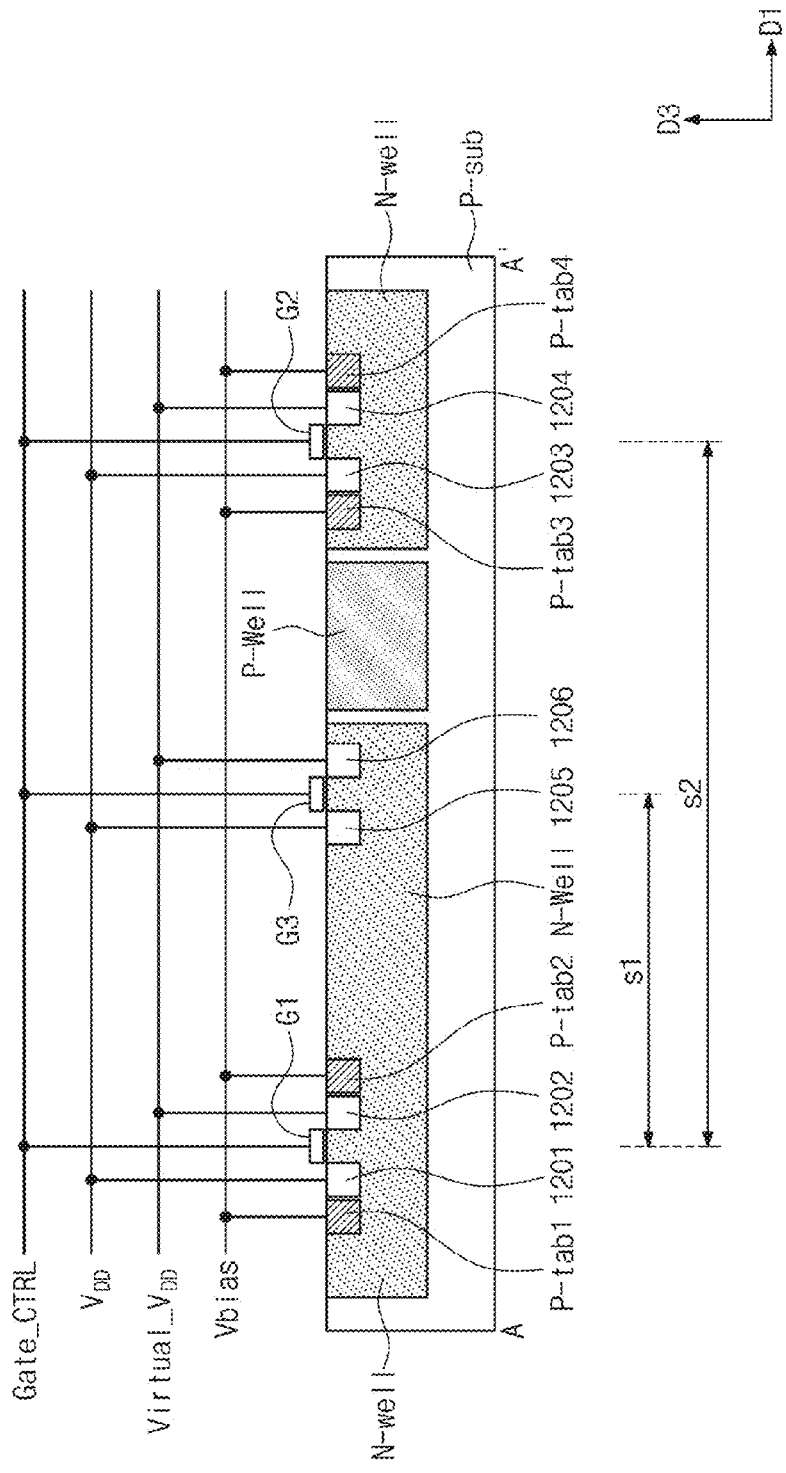
FIG. 18B is a sectional view taken along line A-A' of FIG. 18A according to an exemplary embodiment of the present inventive concept.

FIG. 18B is a sectional view taken along line A-A' of FIG. 18A according to an exemplary embodiment of the present inventive concept. The elements of FIG. 18B correspond to those of FIG. 12. Accordingly, referring to FIGS. 18B and 12, mainly differences between these two figures will be described. For example, FIG. 18B shows discontinued N-wells for the first to third PMOS power gate cells in direction D1 and a P-well for a NMOS transistor of one of the standard cells disposed between the discontinued N-wells on a P-sub in the sectional view. A NMOS transistor of the standard cells may be formed on the P-well.

Figure 18C:
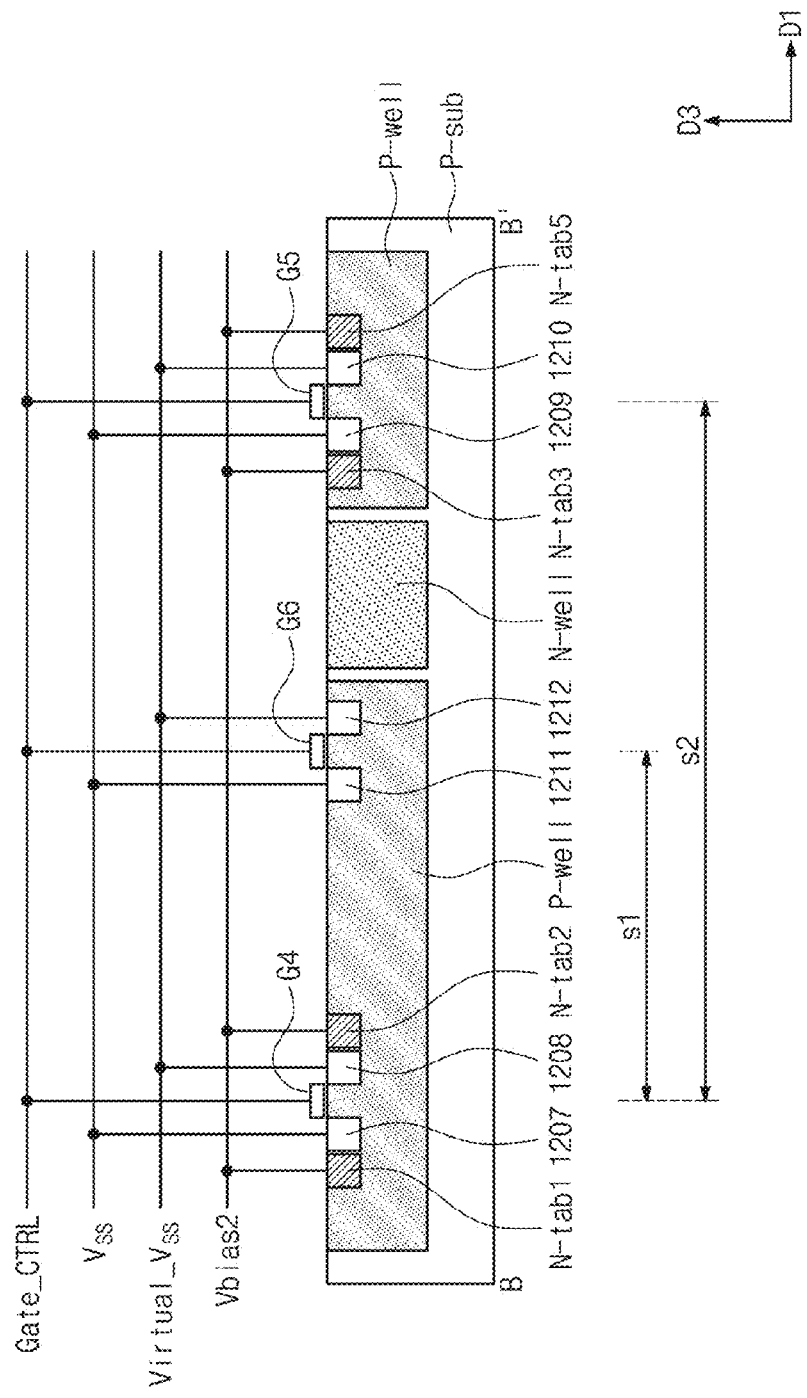
FIG. 18C is a sectional view taken along line B-B' of FIG. 18A according to an exemplary embodiment of the present inventive concept.

FIG. 18C is a sectional view taken along line B-B' of FIG. 18A according to an exemplary embodiment of the present inventive concept. The elements of FIG. 18C correspond to those of FIG. 13. Accordingly, referring to FIGS. 18C and 13, mainly differences between these two figures will be described. For example, FIG. 18C shows discontinued P-wells for the fourth to sixth NMOS power gate cells in direction D1 and a N-well for a PMOS transistor of one of the standard cells disposed between the discontinued P-wells on a P-sub in the sectional view. A PMOS transistor of the standard cells may be formed on the N-well.

Figure 19:
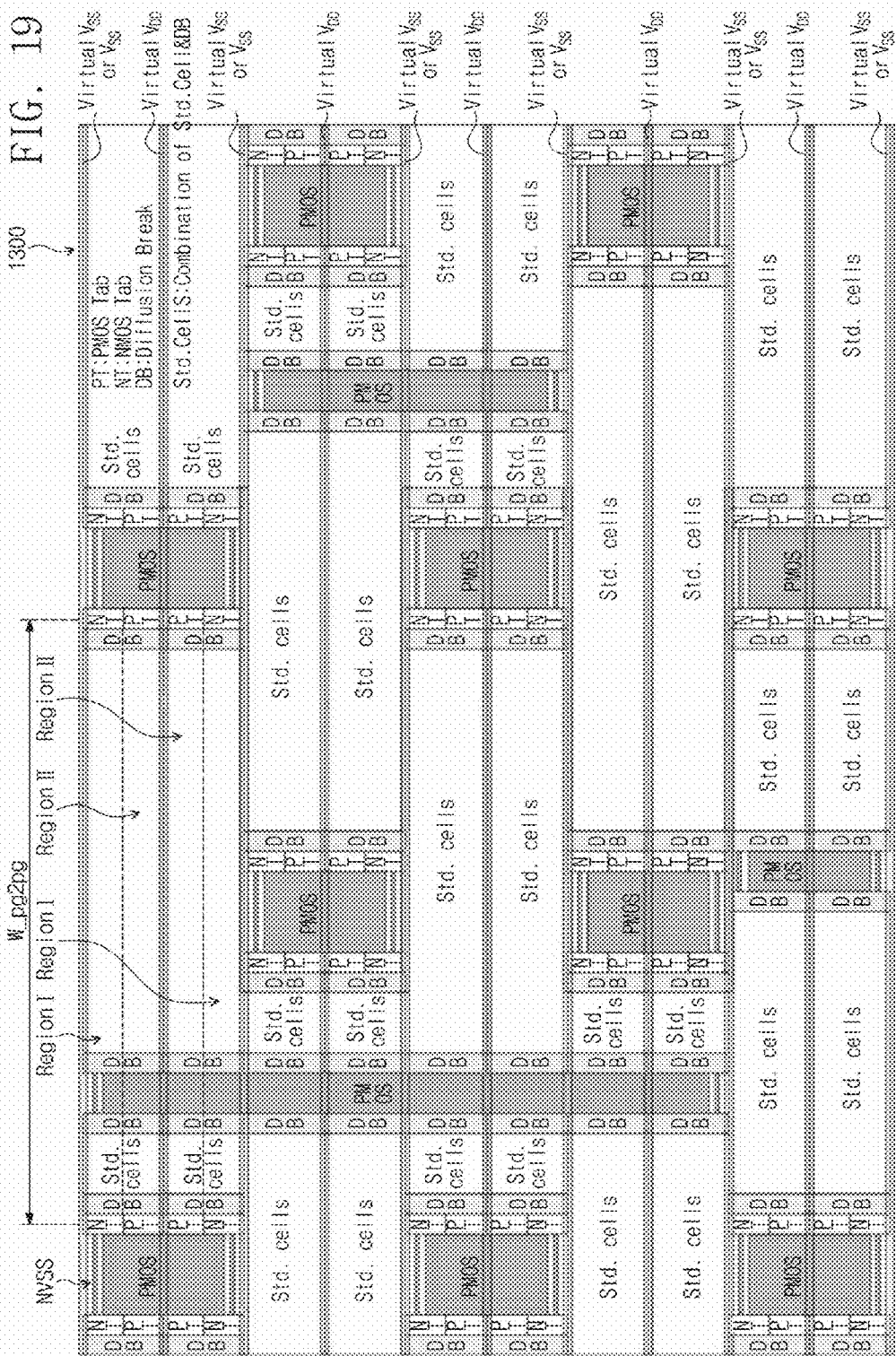
FIG. 19 is a plan view illustrating a layout of a semiconductor device that is applied to a power gate switching system according to an exemplary embodiment of the present inventive concept.

FIG. 19 is a plan view illustrating a layout of a semiconductor device that is applied to a power gate switching system according to an exemplary embodiment of the present inventive concept.

In particular, FIG. 19 shows a plurality of PMOS power gate cells connected to a plurality of metal power lines Virtual VDD and VSS (or Virtual VSS). Each of the PMOS power gating cells may have at least one of p-tabs on both sides and N-tabs on both sides. This can be seen in FIG. 19 which identifies a PMOS tap (or tab) as "PT", an NMOS tap (or tab) as "NT", a diffusion break as "DB" and standard cells as "Std. Cells". FIG. 19 further shows VSS (of Virtual VSS) extending lengthwise along the top and bottom of a row of PMOS power gate cells. In addition, one of the metal power lines Virtual VDD and VSS (or Virtual VSS) extends lengthwise through the middle of each row of PMOS power gate cells. A distance W_pg2pg may be a minimum distance required between power gates.

It is to be further understood that in a standard cell region, for example Region I in FIG. 19, there may be a P-well. In addition, there may be an N-well in a region Region II adjacent to Region I. The N-well Region II may be intersected by metal power line Virtual VDD. Furthermore, the line disposed between the NMOS taps NT may be a power line NVSS to connect the NMOS taps NT to each other.

Referring to FIG. 19, the semiconductor device 1300 may include a plurality of types of power gate cells. For example, a first type of PMOS power gate cell may include p-tabs PTs on both side of the PMOS power gate transistor in the PMOS power gate cell. The first type of PMOS power gate cell may include n-tabs NTs on both ends of the PMOS power gate cell. The PMOS power gate cell may include one or more PMOS transistors connected in parallel between Virtual VDD and Virtual VSS (or VSS). A second type of PMOS power gate cell may include one or more PMOS transistors connected in parallel between Virtual VDD and Virtual VSS (or VSS) without p-tabs PTs or n-tabs NTs on both ends of the PMOS power gate cell. The number of PMOS transistors may be proportional to a current driving capacity of the PMOS power gate cell.

A first type of PMOS power gate cell may be aligned in a vertical area which includes a plurality of virtual power lines Virtual VDDs and a second type of PMOS power gate cell may be aligned in a vertical area which includes a plurality of virtual power lines Virtual VDDs. A position, type or a number of PMOS power gate cells in a floor plan of the semiconductor device 1300 may vary according to a power which is provided by the PMOS power gate cells.

According to an exemplary embodiment of the inventive concept, it is possible to provide a power gate switching system configured to effectively supply a virtual power voltage to a region of a semiconductor device, at which a large voltage drop may occur.

According to an exemplary embodiment of the inventive concept, it is possible to realize a power gate switching system with improved area efficiency.

While the present inventive concept has been particularly shown and described with reference to exemplary embodiments thereof, it will be understood by one of ordinary skill in the art that variations in form and detail may be made therein without departing from the spirit and scope of the attached claims.

What is claimed is:

1. A power gate switching system, comprising:
a first row including a first virtual power line, a first power gate cell and a second power gate cell, wherein the first power gate cell includes a first gate electrode disposed between first and second diffusion regions, and at least one tab, wherein the second power gate cell includes a second gate electrode disposed between third and fourth diffusion regions and does not include a tab; and
a second row including a second virtual power line, a third power gate cell and a fourth power gate cell, wherein the third power gate cell includes a third gate electrode disposed between fifth and sixth diffusion regions, and at least one tab, and the fourth power gate cell includes a fourth gate electrode disposed between seventh and eighth diffusion regions and does not include a tab, and wherein the fourth power gate cell is connected to the second power gate cell.

2. The power gate switching system of claim 1, wherein the first and second rows are extended in a first direction and a gate control line of the second and fourth power gate cells are extended in a second direction substantially perpendicular to the first direction.

3. The power gate switching system of claim 1, wherein the first power gate cell includes a device isolation layer adjacent to the at least one tab, and the second power gate cell includes a device isolation layer adjacent to each of the third and fourth diffusion regions.

4. The power gate switching system of claim 1, further comprising:
a third row including a third virtual power line, a fifth power gate cell and a sixth power gate cell, wherein the fifth power gate cell includes a fifth gate electrode disposed between ninth and tenth diffusion regions, and at least one tab, and the sixth power gate cell includes a sixth gate electrode disposed between eleventh and twelfth diffusion regions and does not include a tab, and wherein the sixth power gate cell is connected to the fourth power gate cell.

5. The power gate switching system of claim 4, wherein the first and fifth power gate cells are disposed in a first column, and the second, fourth and sixth power gate cells are disposed in a second column.

6. The power gate switching system of claim 5, wherein the first to third rows are extended in a first direction and the first and second columns are extended in a second direction substantially perpendicular to the first direction.

7. The power gate switching system of claim 1, wherein a width of a channel of the first power gate cell in a row direction is greater than a width of a channel of the second power gate cell in the row direction.

8. The power gate switching system of claim 1, wherein the size of the first power gate cell is greater than the size of the second power gate cell.

9. The power gate switching system of claim 4, wherein a gate control signal line of the second, fourth and sixth power gate cells extends across the first, second and third virtual power lines.

10. The power gate switching system of claim 1, wherein the first power gate cell includes a diffusion break adjacent to the at least one tab, and the second power gate cell includes a diffusion break adjacent to each of the third and fourth diffusion regions.

11. A power gate switching system, comprising:
a first row including a first power line, a first power gate cell and a second power gate cell, wherein the first power gate cell includes a first gate electrode disposed between first and second diffusion regions, and at least one tab, wherein the second power gate cell includes a second gate electrode disposed between third and fourth diffusion regions and does not include a tab; and
a second row including a second power line, a third power gate cell and a fourth power gate cell, wherein the third power gate cell includes a third gate electrode disposed between fifth and sixth diffusion regions, and at least one tab, and the fourth power gate cell includes a fourth gate electrode disposed between seventh and eighth diffusion regions and does not include a tab.

12. The power gate switching system of claim 11, wherein the first and second power lines are virtual power lines.

13. The power gate switching system of claim 11, wherein a standard cell is disposed between the first and second power gate cells in the first row.

14. The power gate switching system of claim 11, wherein the at least one tab of the first power gate cell is an NMOS tab or a PMOS tab.

15. The power gate switching system of claim 11, wherein the first power gate cell has first and second sides and includes a first PMOS tab and a first NMOS on the first side.

16. The power gate switching system of claim 15, wherein the first power gate cell includes a second PMOS tab and a second NMOS tab on the second side.

17. The power gate switching system of claim 11, wherein the at least one tab of the first power gate cell is disposed between the first diffusion region and the first gate electrode or the second diffusion region and the first gate electrode.

18. A power gate switching system, comprising:
- a first row including a first power line, a first power gate cell, a second power gate cell and a first standard cell disposed between the first and second power gate cells, wherein the first power gate cell includes a first gate electrode disposed between first and second diffusion regions, and at least one tab, wherein the second power gate cell includes a second gate electrode disposed between third and fourth diffusion regions and does not include a tab;
- a second row including a second power line, a third power gate cell, a fourth power gate cell and a second standard cell disposed between the third and fourth power gate cells, wherein the third power gate cell includes a third gate electrode disposed between fifth and sixth diffusion regions, and at least one tab, and the fourth power gate cell includes a fourth gate electrode disposed between seventh and eighth diffusion regions and does not include a tab; and
- a third row including a third standard cell, a fourth standard cell and a fifth power gate cell disposed between the third and fourth standard cells, wherein the fifth power gate cell includes a fifth gate electrode disposed between ninth and tenth diffusion regions and does not include a tab.

19. The power gate switching system of claim 18, wherein the first power gate cell is adjacent to the third power gate cell, the first standard cell is adjacent to the second standard cell and the second power gate cell is adjacent to the fourth power gate cell.

20. The power gate switching system of claim 18, wherein the fifth power gate cell is adjacent to the fourth power gate cell.

* * * * *